US010613483B2

United States Patent
Komatsu et al.

(10) Patent No.: US 10,613,483 B2
(45) Date of Patent: Apr. 7, 2020

(54) INTEGRATED CIRCUIT DEVICE, PHYSICAL QUANTITY MEASURING DEVICE, ELECTRONIC APPARATUS, AND VEHICLE

(71) Applicant: Seiko Epson Corporation, Tokyo (JP)

(72) Inventors: Fumikazu Komatsu, Okaya (JP); Akio Tsutsumi, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/043,789

(22) Filed: Jul. 24, 2018

(65) Prior Publication Data

US 2019/0033793 A1  Jan. 31, 2019

(30) Foreign Application Priority Data

Jul. 25, 2017 (JP) ................. 2017-143163

(51) Int. Cl.
G04F 10/00 (2006.01)
H03L 7/07 (2006.01)
H03D 13/00 (2006.01)
H03K 5/24 (2006.01)
B60R 16/023 (2006.01)
H03L 7/089 (2006.01)
B60R 16/027 (2006.01)
G01R 19/165 (2006.01)
G01R 19/25 (2006.01)

(52) U.S. Cl.
CPC .......... G04F 10/005 (2013.01); B60R 16/027 (2013.01); B60R 16/0232 (2013.01); G01R 19/16576 (2013.01); H03D 13/00 (2013.01); H03D 13/004 (2013.01); H03K 5/249 (2013.01); H03L 7/07 (2013.01); H03L 7/0891 (2013.01); G01R 19/2509 (2013.01)

(58) Field of Classification Search
CPC . G04F 10/005; B60R 16/0232; B60R 16/027; G01R 19/16576; H03D 13/00; H03D 13/004; H03K 5/249; H03L 7/07; H03L 7/0891
See application file for complete search history.

(56) References Cited

U.S. PATENT DOCUMENTS 7,756,219 B2 *  7/2010 Beyer ...................... H04B 1/04
                                                              375/135
2018/0088160 A1 *  3/2018 Maki ...................... G01R 23/10

FOREIGN PATENT DOCUMENTS

JP         05-087954 A     4/1993

* cited by examiner

Primary Examiner — Dinh T Le
(74) Attorney, Agent, or Firm — Harness, Dickey & Pierce, P.L.C.

(57) ABSTRACT

An integrated circuit device includes: an AFE circuit (analog front-end circuit) that receives a first signal and a second signal, carries out waveform shaping of the first signal and waveform shaping of the second signal, outputs the first signal whose waveform is shaped to a first signal line, and outputs the second signal whose waveform is shaped to a second signal line; and a time-to-digital converter that receives the first signal from the AFE circuit via the first signal line, receives the second signal from the AFE circuit via the second signal line, and converts a time difference between transition timings of the first signal and the second signal into a digital value. At least one of the first signal line and the second signal line has redundant wiring for isometric wiring.

17 Claims, 19 Drawing Sheets

INTEGRATED CIRCUIT DEVICE, PHYSICAL QUANTITY MEASURING DEVICE, ELECTRONIC APPARATUS, AND VEHICLE

BACKGROUND

1. Technical Field

The present invention relates to an integrated circuit device, a physical quantity measuring device, an electronic apparatus, and a vehicle.

2. Related Art

As a related-art time-digital conversion technique to convert a time into a digital value, for example, a technique disclosed in JP-A-5-87954 is known. JP-A-5-87954 discloses a micro time measuring device including: a first quartz crystal resonator which outputs a first clock pulse; a second quartz crystal resonator which outputs a second clock pulse; an edge coincidence detection circuit; a synchronous counter; a microcomputer; and a transmission time control unit. The edge coincidence detection circuit detects a synchronization point of the first and second clock pulses. The synchronous counter performs counting synchronously with the first and second clock pulses. The microcomputer calculates an unknown time from a start pulse to a stop pulse, based on the value of the synchronous counter. The transmission time control unit outputs a start pulse according to the output from the edge coincidence detection circuit and the values of the synchronous counter and the microcomputer.

The micro time measuring device of JP-A-5-87954 does not propose any technique for reducing adverse effects on time-digital conversion of the parasitic resistance and parasitic capacitance of signal lines of a start signal and a stop signal.

SUMMARY

An advantage of some aspects of the invention is to solve at least a part of the problems described above, and the invention can be implemented as the following forms or configurations.

An aspect of the invention relates to an integrated circuit device including: an analog front-end circuit that receives a first signal and a second signal, carries out waveform shaping of the first signal and waveform shaping of the second signal, outputs the first signal whose waveform is shaped to a first signal line, and outputs the second signal whose waveform is shaped to a second signal line; and a time-to-digital converter that receives the first signal from the analog front-end circuit via the first signal line, receives the second signal from the analog front-end circuit via the second signal line, and converts a time difference between transition timings of the first signal and the second signal into a digital value. At least one of the first signal line and the second signal line has redundant wiring for isometric wiring.

According to the aspect of the invention, the first and second signals whose waveforms are shaped by the analog front-end circuit are inputted to the time-to-digital converter via the first and second signal lines, and time-digital conversion to convert the time difference between the transition timings of the first and second signals into a digital value is carried out. At least one of the first and second signal lines has redundant wiring. Therefore, reducing the difference between the lengths of the first signal line and the second signal line using the redundant wiring can reduce the difference between the parasitic resistances or parasitic capacitances of the signal lines. This can reduce an error in the result of time-digital conversion caused by the difference in parasitic resistance or parasitic capacitance due to the difference between the lengths of the signal lines and thus can improve the performance of time-digital conversion.

In the aspect of the invention, both of the first signal line and the second signal line may have the redundant wiring. One signal line of the first signal line and the second signal line may have a longer redundant wiring length than the other signal line.

With this configuration, when one signal line has a shorter wiring length in shortest-path wiring, the redundant wiring length of the one signal line can be made longer, thus realizing isometric wiring.

Another aspect of the invention relates to an integrated circuit device including: an analog front-end circuit that receives a first signal and a second signal, carries out waveform shaping of the first signal and waveform shaping of the second signal, outputs the first signal whose waveform is shaped from a first signal output terminal, and outputs the second signal whose waveform is shaped from a second signal output terminal; a time-to-digital converter that receives the first signal from the analog front-end circuit via a first signal input terminal, receives the second signal from the analog front-end circuit via a second signal input terminal, and converts a time difference between transition timings of the first signal and the second signal inputted thereto, into a digital value; a first signal line connecting the first signal output terminal and the first signal input terminal; and a second signal line connecting the second signal output terminal and the second signal input terminal. The first signal line has first redundant wiring. The second signal line has second redundant wiring. DL1<DL2 and RL1>RL2, or DL1>DL2 and RL1<RL2 hold, where DL1 is a distance between the first signal output terminal and the first signal input terminal, DL2 is a distance between the second signal output terminal and the second signal input terminal, RL1 is a wiring length of the first redundant wiring, and RL2 is a wiring length of the second redundant wiring.

According to the aspect of the invention, when the distance DL1 between the first signal output terminal and the first signal input terminal is shorter than the distance DL2 between the second signal output terminal and the second signal input terminal, the wiring length RL1 of the first redundant wiring is longer than the wiring length RL2 of the second redundant wiring. Meanwhile, when the distance DL2 between the second signal output terminal and the second signal input terminal is shorter than the distance DL1 between the first signal output terminal and the first signal input terminal, the wiring length RL2 of the second redundant wiring is longer than the wiring length RL1 of the first redundant wiring. Thus, even when one signal line of the first and second signal lines has a shorter distance between the signal output terminal and the signal input terminal than the other signal line and the one signal line has a shorter wiring length in a shortest-path wiring, making the redundant wiring length of the one signal line longer can reduce the difference between the lengths of the first signal line and the second signal line and thus can reduce the difference between the parasitic resistances or parasitic capacitances of the signal lines. This can reduce an error in the result of time-digital conversion caused by the difference in parasitic resistance or parasitic capacitance due to the difference between the lengths of the signal lines and thus can improve the performance of time-digital conversion.

In the aspect of the invention, the first signal line and the second signal line may have the same number of changes in the wiring direction.

This configuration can restrain a decline in the performance of time-digital conversion due to the difference in the number of changes in the wiring direction.

In the aspect of the invention, the first signal line and the second signal line may run parallel to each other with a shield line provided between these signal lines, at a wiring part on a near side from the time-to-digital converter of the wiring part of the first signal line and the second signal line.

With this configuration, the shield line can restrain transmission of a signal noise from one signal line to the other signal line.

In the aspect of the invention, at least one of the first signal line and the second signal line may be arranged with redundant wiring, at a wiring part on a far side from the time-to-digital converter of the wiring part of the first signal line and the second signal line.

With this configuration, redundant wiring can be provided at a wiring part on far side from the time-to-digital converter and the shield line can reduce the signal noise at a wiring part on the near side from the time-to-digital converter.

In the aspect of the invention, the integrated circuit device may include: a first clock signal generation circuit which has a first oscillation circuit, causes the first oscillation circuit to oscillate a first resonator, and outputs a first clock signal thus generated; and a second clock signal generation circuit which has a second oscillation circuit, causes the second oscillation circuit to oscillate a second resonator, and outputs a second clock signal thus generated. The time-to-digital converter may carry out time-digital conversion based on the first clock signal and the second clock signal.

Carrying out time-digital conversion using the first and second clock signals generated by the first and second resonators in this manner can improve the performance of time-digital conversion.

In the aspect of the invention, the first clock signal generation circuit may output the first clock signal to a first clock signal line. The second clock signal generation circuit may output the second clock signal to a second clock signal line. The time-to-digital converter may receive the first clock signal from the first clock signal generation circuit via the first clock signal line, receive the second clock signal from the second clock signal generation circuit via the second clock signal line, and carry out time-digital conversion based on the first clock signal and the second clock signal. At least one of the first clock signal line and the second clock signal line may have redundant wiring for isometric wiring.

With this configuration, isometric wiring of the clock signal lines can be achieved using the redundant wiring, thus equalizing the parasitic resistances or parasitic capacitances of the clock signal lines. This can restrain a decline in the performance of time-digital conversion due to the parasitic resistances and parasitic capacitances of the clock signal lines.

In the aspect of the invention, one clock signal line of the first clock signal line and the second clock signal line may have a longer redundant wiring length than the other clock signal line.

With this configuration, even when one clock signal line has a shorter wiring length in a shortest-path wiring, the redundant wiring length of the one clock signal line can be made longer, thus realizing isometric wiring.

In the aspect of the invention, the first clock signal line and the second clock signal line may run parallel to each other with a shield line provided between these clock signal lines, at a wiring part on a near side from the time-to-digital converter of the wiring part of the first clock signal line and the second clock signal line.

With this configuration, the shield line can restrain transmission of a clock noise from one clock signal line to the other clock signal line.

In the aspect of the invention, at least one of the first clock signal line and the second clock signal line may be arranged with redundant wiring, at a wiring part on a far side from the time-to-digital converter of the wiring part of the first clock signal line and the second clock signal line.

With this configuration, redundant wiring can be provided at a wiring part on the far side from the time-to-digital converter and the shield line can reduce the clock noise at a wiring part on the near side from the time-to-digital converter.

Still another aspect of the invention relates to an integrated circuit device including: an analog front-end circuit which outputs first to n-th start signals (n being an integer equal to or greater than 2) whose waveforms are shaped, from first to n-th start signal output terminals, based on a start signal, and outputs first to n-th stop signals whose waveforms are shaped, from first to n-th stop signal output terminals, based on a stop signal; a time-to-digital converter which receives the first to n-th start signals from the analog front-end circuit via first to n-th start signal input terminals, receives the first to n-th stop signals from the analog front-end circuit from first to n-th stop signal input terminals, and carries out time-digital conversion based on the first to n-th start signals and the first to n-th stop signals inputted thereto; first to n-th start signal lines connecting the first to n-th start signal output terminals and the first to n-th start signal input terminals; and first to n-th stop signal lines connecting the first to n-th stop signal output terminals and the first to n-th stop signal input terminals. The j-th stop signal line (where $1 \leq j \leq n$) has j-th redundant wiring. The k-th stop signal line (where $1 \leq j \leq n$, $j \neq k$) has k-th redundant wiring. A distance between the j-th stop signal output terminal and the j-th stop signal input terminal is shorter than a distance between the k-th stop signal output terminal and the k-th stop signal input terminal. The j-th redundant wiring is longer than the k-th redundant wiring.

According to the aspect of the invention, when the distance between the j-th stop signal output terminal and the j-th stop signal input terminal is shorter than the distance between the k-th stop signal output terminal and the k-th stop signal input terminal, the j-th redundant wiring of the j-th stop signal line is longer than the k-th redundant wiring of the k-th stop signal line. Making the j-th redundant wiring of the j-th stop signal line longer than the k-th redundant wiring of the k-th stop signal line in this way can reduce the difference between the lengths of the j-th stop signal line and the k-th stop signal line and thus can reduce the difference between the parasitic resistances or parasitic capacitances of the stop signal lines. This can reduce an error in the result of time-digital conversion caused by the difference in parasitic resistance or parasitic capacitance due to the difference between the lengths of the stop signal lines and thus can improve the performance of time-digital conversion.

In the aspect of the invention, the j-th stop signal line and the k-th stop signal line may be provided as isometric wiring.

Arranging the j-th and k-th stop signal lines as isometric wiring in this way can improve the performance of time-digital conversion.

In the aspect of the invention, the integrated circuit device may include a terminal region where a first signal terminal for the first signal and a second signal terminal for the second signal are arranged. When a direction from a first side of the integrated circuit toward a second side opposite the first side is defined as a first direction, the analog front-end circuit may be arranged on the first direction side of the terminal region, and the time-to-digital converter may be arranged at least on one side of the first direction side of the analog front-end circuit and the side of a direction intersecting the first direction.

This configuration enables efficient connection of signal lines between the first and second signal terminals and the analog front-end circuit and between the analog front-end circuit and the time-to-digital converter. This can restrain a decline in the performance of time-digital conversion due to the parasitic resistances and parasitic capacitances of the signal lines.

Still another aspect of the invention relates to a physical quantity measuring device including the foregoing integrated circuit device.

Still another aspect of the invention relates to an electronic apparatus including the foregoing integrated circuit device.

Still another aspect of the invention relates to a vehicle including the foregoing integrated circuit device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. However, the embodiment described below should not unduly limit the content of the invention described in the appended claims. Not all the configurations described in the embodiment are necessarily essential as the solutions of the invention.

1 Configuration of Integrated Circuit Device and Wiring Method

Figure 1:
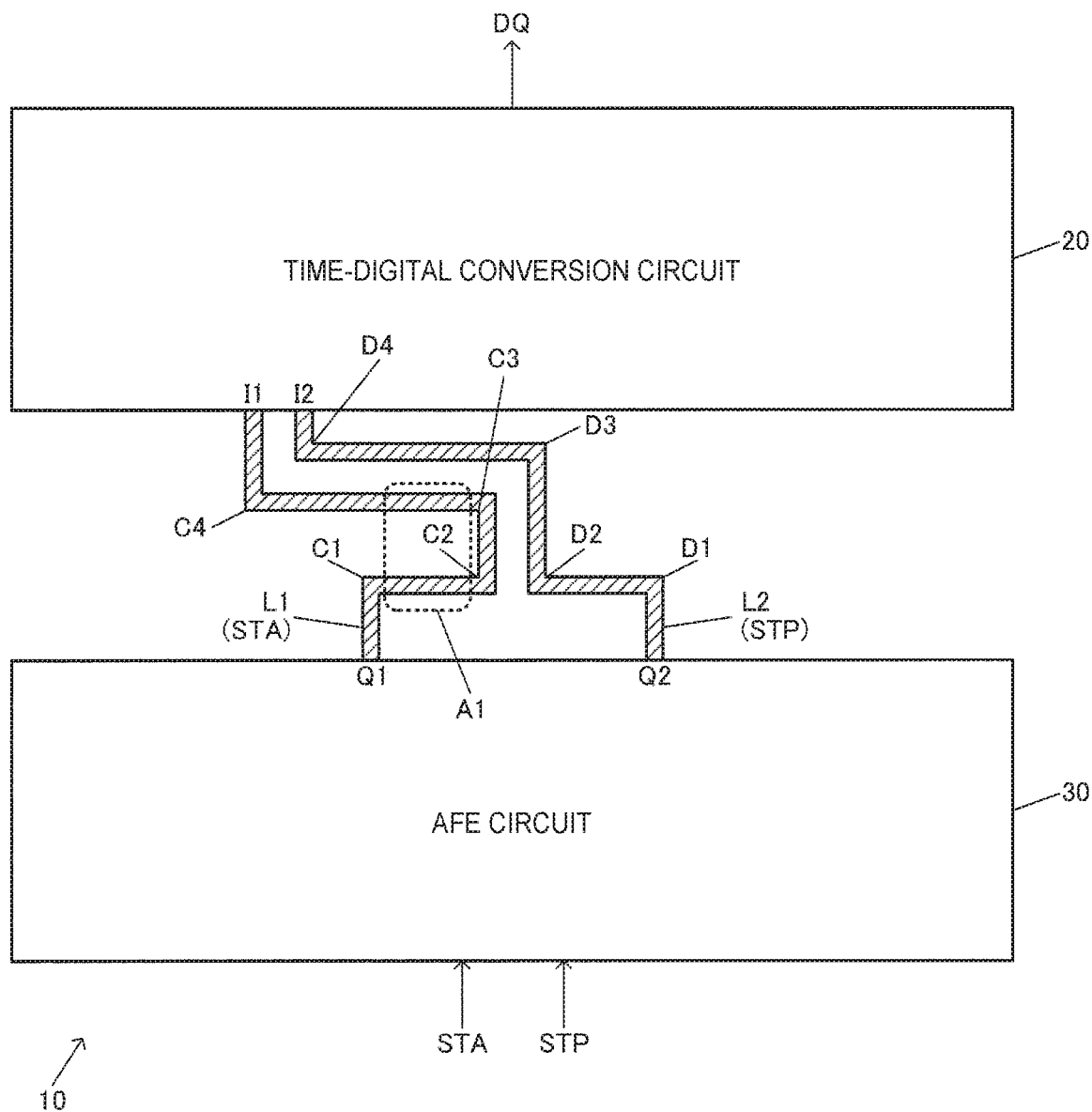
FIG. 1 is an explanatory view of the configuration of an integrated circuit device and a wiring method for signal lines according to an embodiment.
Figure 7:
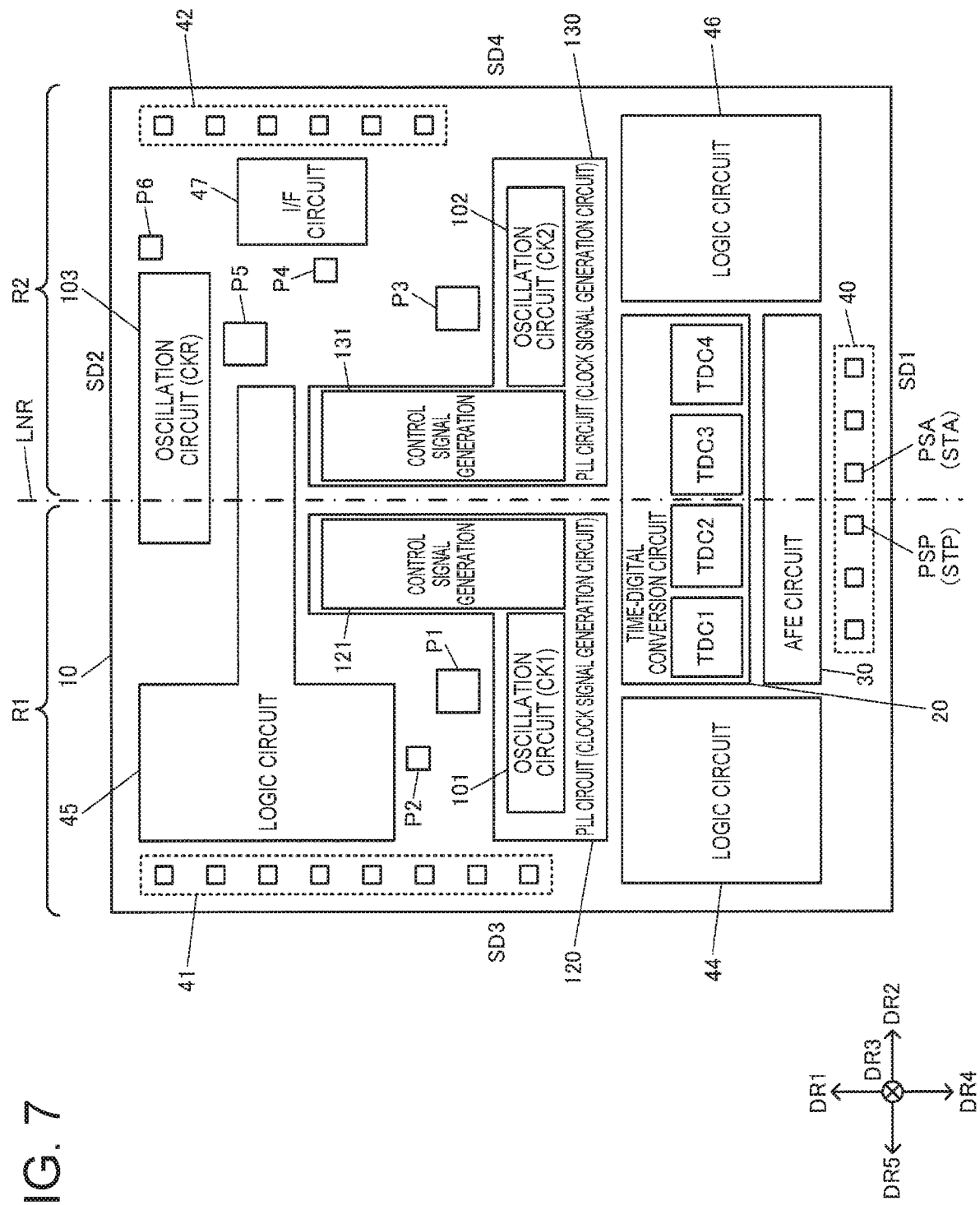
FIG. 7 shows an example of the layout of the integrated circuit device according to the embodiment.
Figure 8:
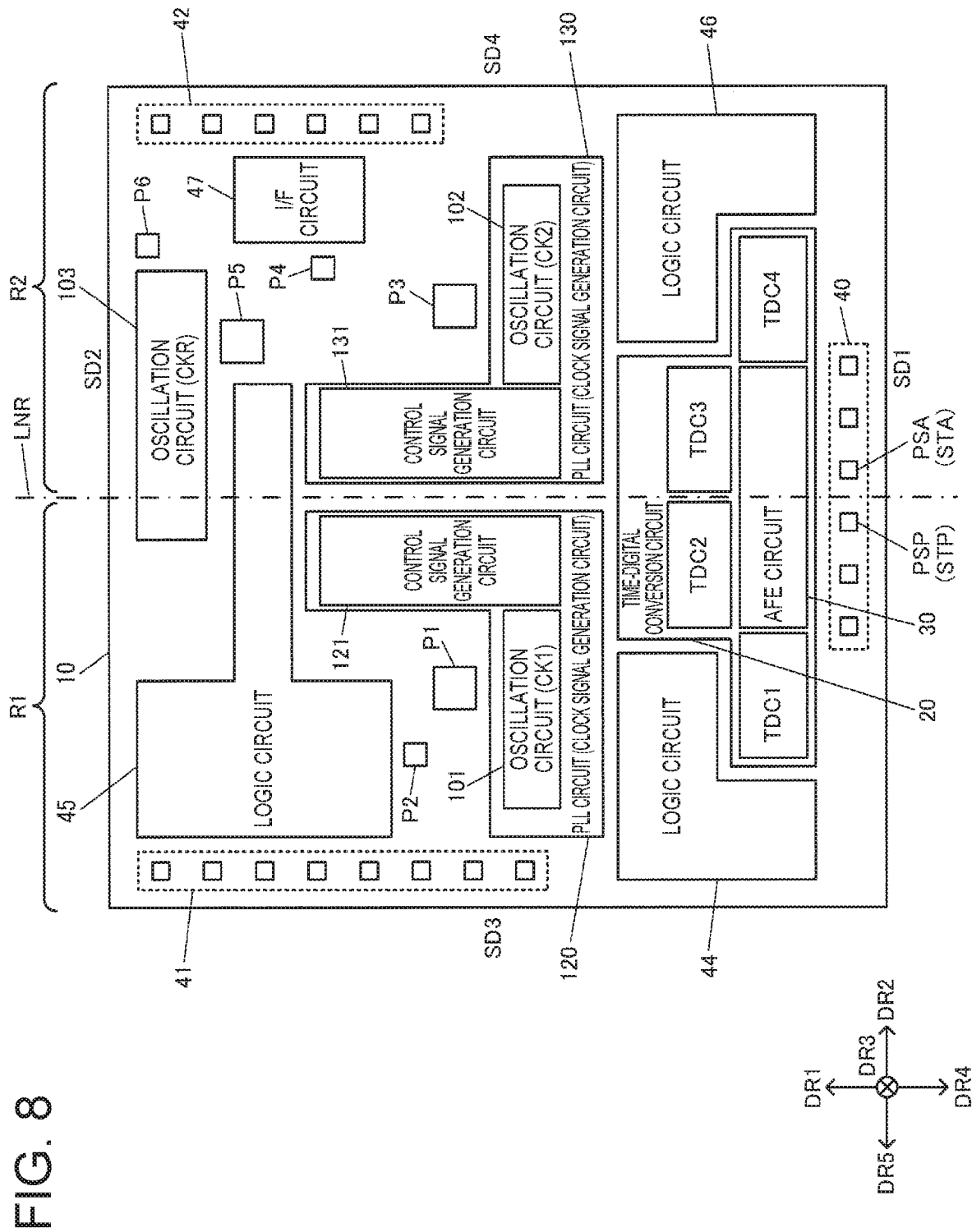
FIG. 8 shows an example of the layout of the integrated circuit device according to the embodiment.

FIG. 1 shows a configuration example of an integrated circuit device 10 according to this embodiment. The integrated circuit device 10 (IC) according to this embodiment includes an AFE circuit 30 (analog front-end circuit) and a time-to-digital converter 20. The AFE circuit 30 carries out waveform shaping (buffering) of a signal. For example, the AFE circuit 30 shapes a signal having a rounded waveform into a signal having a square waveform or the like. The AFE circuit 30 (waveform shaping circuit, buffering circuit) has a signal STA (first signal, start signal) and a signal STP (second signal, stop signal) inputted thereto. The signals STA, STP are inputted, for example, from signal terminals PSA, PSP of the integrated circuit device 10, as shown in FIGS. 7 and 8, described later. The AFE circuit 30 carries out waveform shaping of the signals STA and STP. For example, the AFE circuit 30 carries out waveform shaping of the signals STA, STP, via a comparator which compares the signals STA, STP of rounded waveforms with a predetermined threshold voltage, and a buffer circuit or the like. The AFE circuit 30 then outputs the signals STA, STP whose waveforms are shaped, to signal lines L1, L2 (first signal line, second signal line). The signal lines L1, L2 are, for example, signal lines arranged in a wiring region between the AFE circuit 30 and the time-to-digital converter 20 and are made up of, for example, a metal layer such as aluminum.

The time-to-digital converter 20 converts the time difference between the transition timings of the signals STA and STP into a digital value DQ. The time-to-digital converter 20 has the signal STA inputted thereto from the AFE circuit 30 via the signal line L1 and has the signal STP inputted thereto from the AFE circuit 30 via the signal line L2. The signals STA, STP inputted from the signal lines L1, L2 are the signals whose waveforms are shaped by the AFE circuit 30. The time-to-digital converter 20 converts the time difference between the transition timings of the inputted signals STA and STP into a digital value DQ. For example, the time-to-digital converter 20 converts the time difference between the transition timings of the signal STA whose waveform is shaped (square wave signal) and the signal STP whose waveform is shaped (square wave signal), into a digital value DQ. This time-digital conversion may be, for example, time-digital conversion to measure absolute time or the like.

In this embodiment, at least one of the signal lines L1, L2 has redundant wiring for isometric wiring. For example, at least one of the signal lines L1, L2 has redundant wiring (bypass wiring) and this redundant wiring realizes isometric wiring of the signal lines. This can restrain a decline in the performance of time-digital conversion due to the parasitic resistances or parasitic capacitances of the signal lines. Also, one signal line of the signal lines L1, L2 has a longer redundant wiring length than the other signal line. For example, at least one of the signal lines L1, L2 has redundant wiring to achieve isometric wiring of the signal lines L1, L2 and the wiring length of the redundant wiring of one signal line is longer that of the other signal line. Specifically, both of the signal lines L1, L2 have redundant wiring and one signal line has a longer redundant wiring length than the other signal line.

For example, in FIG. 1, the signal line L1 is the one signal line and the signal line L2 is the other signal line. The signal line L1 has redundant wiring for isometric wiring as indicated by A1 in FIG. 1. The signal line L1, which is the one signal line, has a longer redundant wiring length than the signal line L2, which is the other signal line. Forming the redundant wiring as indicated A1 in the signal line L1 realizes isometric wiring where the signal lines L1, L2 have the sane (substantially the same) wiring length. While FIG. 1 shows that the signal line L1 has the redundant wiring for isometric wiring, the signal line L2 may have redundant wiring for isometric wiring, or both of the signal lines L1, L2 may have redundant wiring for isometric wiring. Also, while FIG. 1 shows that the signal line L1 has a longer redundant wiring length than the signal line L2, the signal line L2 may have a longer redundant wiring length than the signal line L1. That is, the one signal line may be the signal line L2 and the other signal line may be signal line L1. The same applies to the other examples described below.

Figure 6:
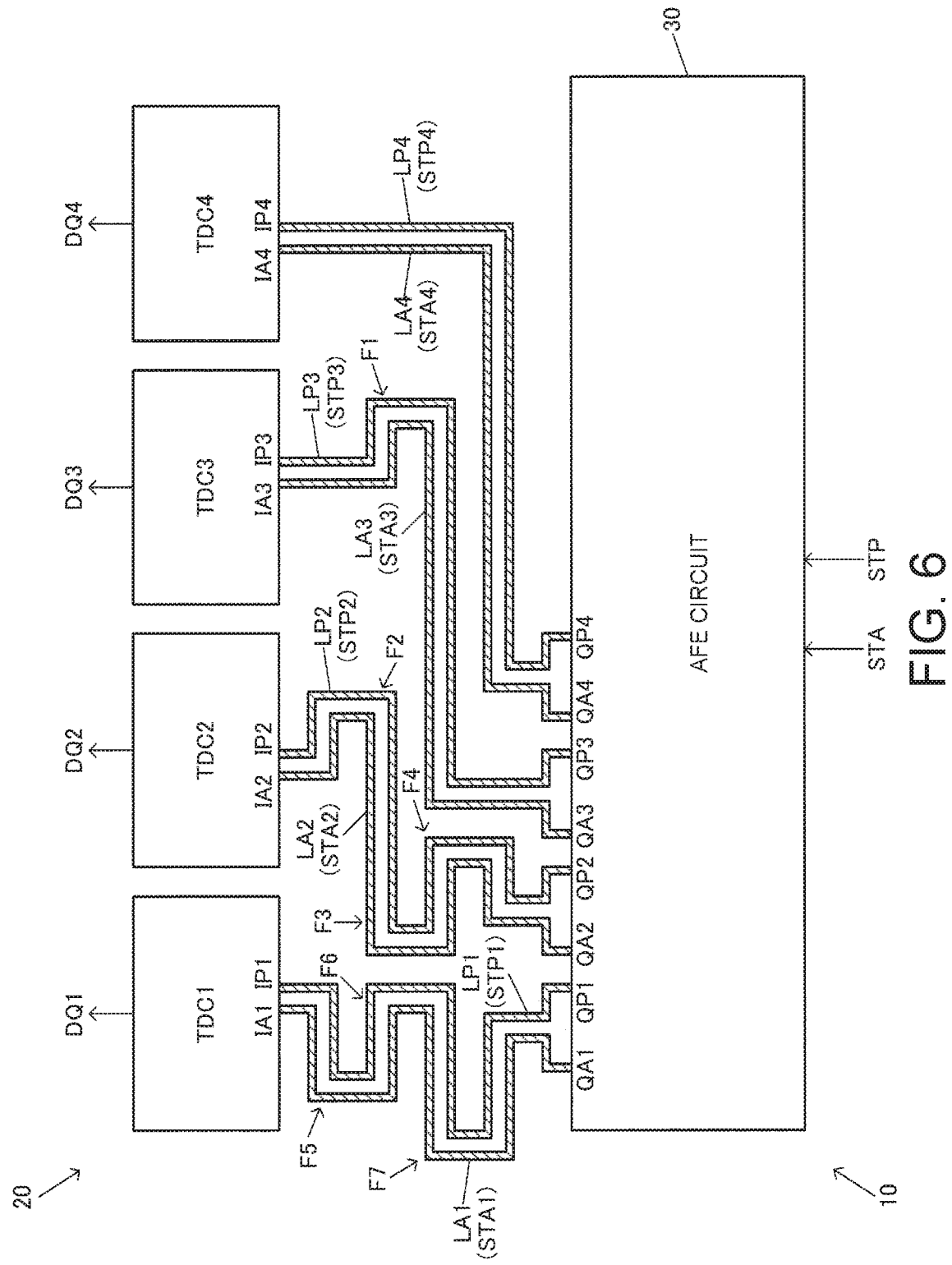
FIG. 6 is an explanatory view of a wiring method for a plurality of start signal lines and a plurality of stop signal lines between an AFE circuit and the time-to-digital converter.

For example, redundant wiring for isometric wiring is wiring that is formed redundantly in order to arrange signal lines as isometric wiring. For example, instead of arranging a signal line in the shortest path, redundant wiring to detour the path of the signal line is provided. This reduces the difference between the wiring lengths of the two signal lines and preferably causing the two signal lines to have the same (substantially the same) wiring length. Arranging the signal lines as isometric wiring means causing the two signal lines to have the same wiring length. However, the wiring lengths need not necessarily be perfectly the same and may be substantially the same within a margin of error allowed with the resolution in time-digital conversion or within a margin of error generated by the waveform shaping by the AFE circuit 30. While FIG. 1 shows that the redundant wiring for isometric wiring as indicated by A1 is provided in order to arrange the signal lines L1, L2 as isometric wiring, the redundant wiring for isometric wiring in the embodiment is not limited to this example. For example, if the AFE circuit 30 and the time-to-digital converter 20 are connected to each other via a plurality of start signal lines and a plurality of stop signal lines, as shown in FIG. 6, described later, redundant wiring may be provided to arrange the start signal lines as isometric wiring or to arrange the stop signal lines as isometric wiring. Having a longer redundant wiring length may means that only the one signal line has redundant wiring while the other signal line does not have redundant wiring, as shown in FIG. 1. Alternatively, it may be the case where both of the one signal line and the other signal line have redundant wiring and where the wiring length of the redundant wiring of the one signal line is longer than the wiring length of the redundant wiring of the other signal line. For example, in FIG. 2, the signal line L1, which is the one signal line, has redundant wirings indicated by E1, E2, and the signal line L2, which is the other signal line, has redundant wiring indicated by E3. The redundant wiring length of the one signal line L1 having the two redundant wirings indicated by E1, E2 is longer than the redundant wiring length of the other signal line L2 having only the one redundant wiring indicated by E3. The redundant wiring length is, for example, the length of the wiring increased by providing redundant wiring. For example, the length of the wiring increased from the shortest-path wiring.

Providing redundant wiring means detouring a signal line on purpose even when the signal line can be arranged in the shortest path. For example, in FIG. 1, the signal line L1 is a signal line connecting a signal output terminal Q1 of the AFE circuit 30 and a signal input terminal I1 of the time-to-digital converter 20. The signal line L2 is a signal line connecting a signal output terminal Q2 of the AFE circuit 30 and a signal input terminal I2 of the time-to-digital converter 20. To connect the signal output terminal Q1 and the signal input terminal I1 in the shortest path, no redundant wiring is needed originally. However, in FIG. 1, redundant wiring for isometric wiring to detour the signal line as indicated by A1 is provided on purpose. That is, originally, there is no need to change the wiring direction of the signal line L1 as indicated by C1, C2, C3 in FIG. 1 and it suffices to arrange the signal line L1 directly upward at the part C1. However, the wiring direction is changed on purpose in order to achieve isometric wiring of the signal lines L1, L2. Thus, the parasitic resistances or parasitic capacitance of the signal lines L1 and L2 can be equalized and a decline in the performance of time-digital conversion due to the parasitic resistances and parasitic capacitances can be restrained.

Figure 2:
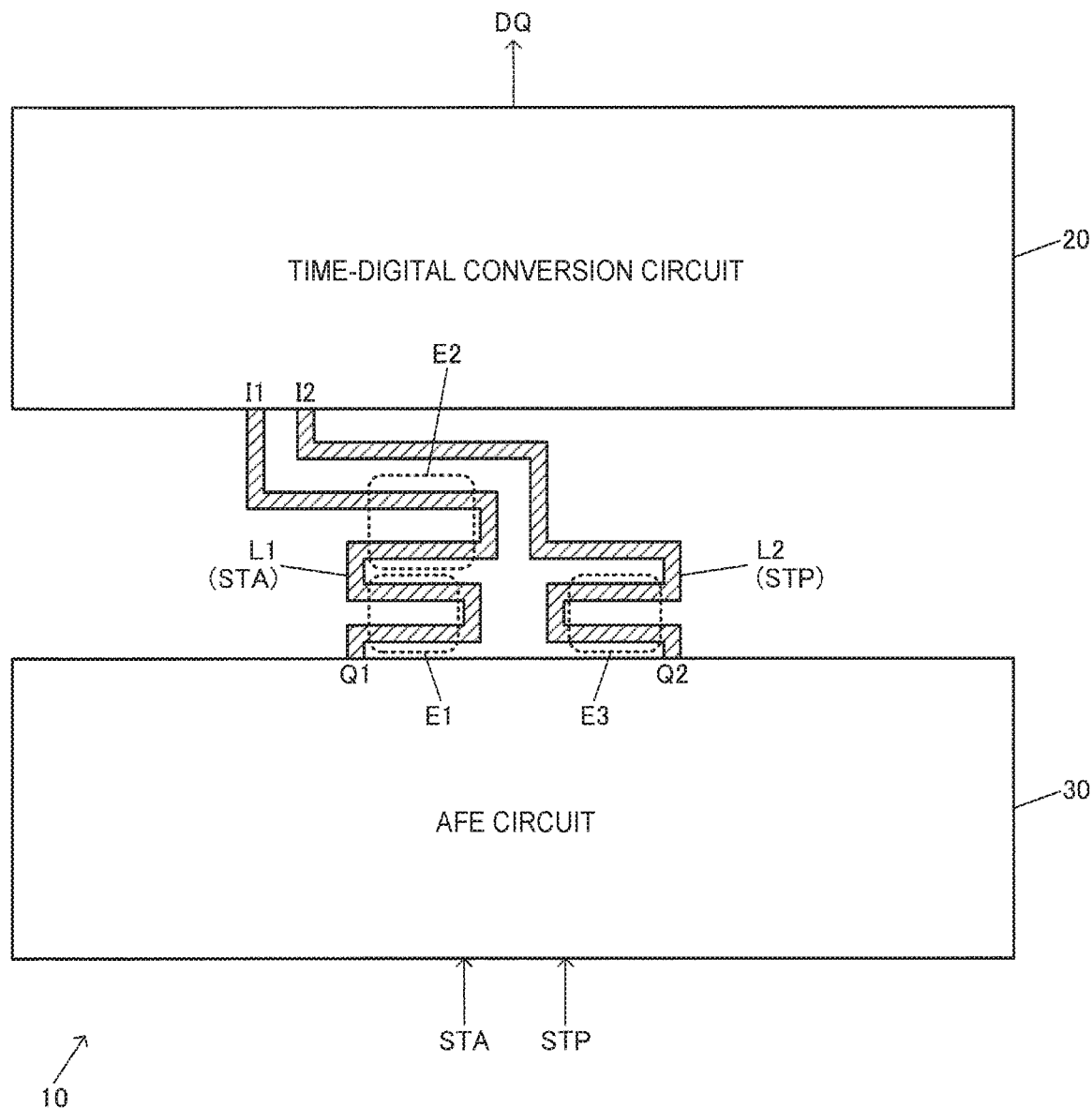
FIG. 2 is an explanatory view of the configuration of the integrated circuit device and the wiring method for signal lines according to the embodiment.
Figure 3:
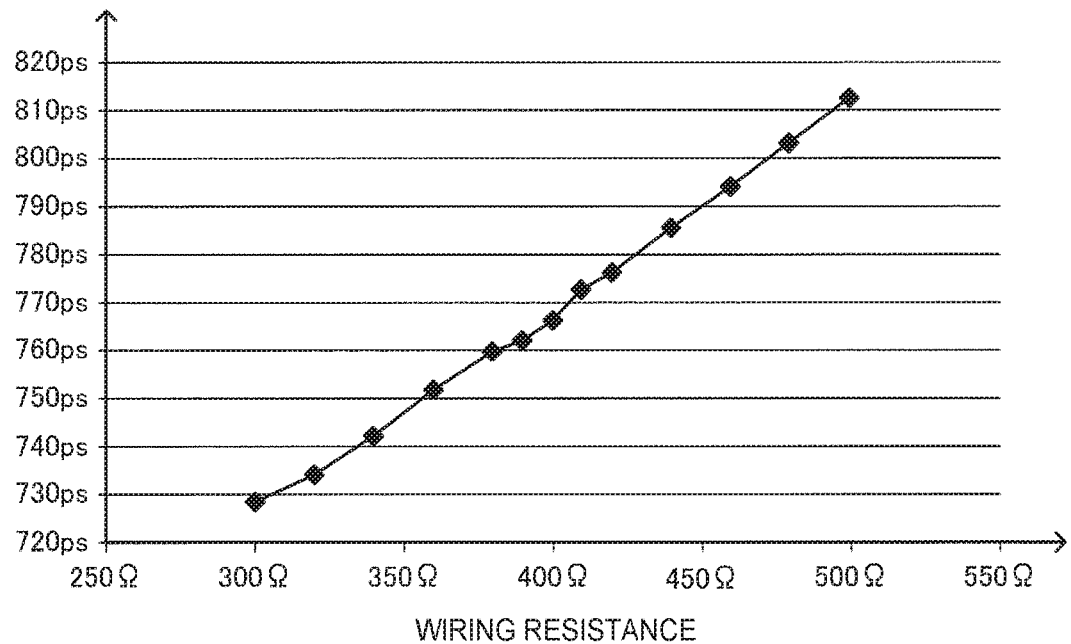
FIG. 3 shows an example of change in the quantity of signal delay when the wiring resistance of a signal line is changed.

For example, FIG. 3 shows the result of a simulation showing changes in the amount of signal delay in relation to changes in the wiring resistance of a signal line. In FIG. 3, the parasitic capacitance of the signal line is fixed to 1 pF. For example, if the wiring resistance changes due to a parasitic resistance component, the amount of signal delay changes by approximately 4 to 6 ps for a resistance change of 10Ω. Therefore, a difference between the parasitic resistances or parasitic capacitances of the signal lines L1, L2 due to the different wiring lengths of these signal lines causes a difference in the amount of signal delay corresponding to this difference and thus causes the time difference between the transition timings of the signals STA and STP to differ from the original time difference. For example, while the original time different is TDF, an error α is generated in the time difference measured by the time-to-digital converter 20 due to the parasitic resistances or parasitic capacitances, thus resulting in TDF±α. In this embodiment, as will be described later, the resolution Δt of time-digital conversion is very low, for example, 10 ps or lower (preferably 1 ps) in order to realize highly accurate time-digital conversion. Therefore, if the difference between the wiring resistances of the signal lines L1, L2 is, for example, 10Ω, the error in the time difference is approximately 4 to 6 ps, which is equivalent to or greater than the resolution Δt, thus lowering the performance of time-digital conversion. In this respect, in the embodiment, at least one of the signal lines L1, L2 have the redundant wiring for isometric wiring (A1, E1 to E3), as shown in FIGS. 1 and 2. For example, the one signal line has a longer redundant wiring length than the other signal line. Thus, isometric wiring of the signal lines L1, L2 can be achieved and the parasitic resistances and parasitic capacitances of the signal lines L1, L2 can be equalized. This can prevent the generation of an error (α) in the time difference between the transition timing of the signals STA and STP due to the parasitic resistances or parasitic capacitances of the signal lines, and can improve the performance of time-digital conversion.

In this embodiment, the distance between the signal output terminal of the AFE circuit 30 and the signal input terminal of the time-to-digital converter 20 in one signal line of the signal lines L1 and L2 is shorter than in the other signal line. Specifically, the AFE circuit 30 carries out waveform shaping of the signals STA and STP, outputs the signal STA whose waveform is shaped from the signal output terminal Q1 (first signal output terminal), and outputs the signal STP whose waveform is shaped from the signal output terminal Q2 (second signal output terminal). The time-to-digital converter 20 has the signal STA from the AFE circuit 30 (signal STA after waveform shaping) inputted thereto from the signal input terminal I1 (first signal input terminal), has the signal STP from the AFE circuit 30 (signal STP after waveform shaping) inputted thereto from the signal input terminal I2 (second signal input terminal), and converts the time difference between the transition timings of the signals STA and STP inputted thereto, into a digital value. The integrated circuit device 10 includes the signal line L1 connecting the signal output terminal Q1 and the signal input terminal I1, and the signal line L2 connecting the signal output terminal Q2 and the signal input terminal I2. The signal line L1 has first redundant wiring, for example, as indicated by E1, E2 in FIG. 2. The signal line L2 has second redundant wiring, for example, as indicated by E3. The distance between the signal output terminal Q1 and the signal input terminal I1 is defined as DL1. The distance between the signal output terminal Q2 and the signal input terminal I2 is defined as DL2. The wiring length of the first redundant wiring (E1, E2) is defined as RL1. The wiring length of the second redundant wiring (E3) is defined as RL2. In this case, in this embodiment, the relations of DL1<DL2 and RL1>RL2 or DL1>DL2 and RL1<RL2 hold.

For example, in FIG. 2, the distance DL1 between the signal output terminal Q1 and the signal input terminal I1 is shorter than the distance DL2 between the signal output terminal Q2 and the signal input terminal I2. If DL1<DL2 holds in this way, the signal lines L1, L2 are arranged in such a way that the wiring length RL1 of the first redundant wiring (E1, E2) of the signal line L1 is longer the wiring length RL2 of the second redundant wiring (E3) of the signal line L2. That is, the signal lines L1, L2 are arranged in such a way that DL1<DL2 and RL1>RL2 hold. For example, given the distances DL1<DL2, if the signal output terminals and the signal input terminals are connected in the shortest path, the wiring length of the signal line L2 connecting the signal output terminal Q2 and the signal input terminal I2 is longer than the wiring length of the signal line L1 connecting the signal output terminal Q1 and the signal input terminal I1. This causes a difference between the wiring lengths of the signal lines L1, L2. Corresponding to this difference, a difference in the amount of signal delay due to the parasitic resistances or parasitic capacitances is generated, thus causing the time difference between the transition timings of the signals STA and STP to differ from the original time difference. This leads to a decline in the performance in time-digital conversion.

In this respect, in this embodiment, the redundant wiring length (RL1) of the signal line L1 having the shorter distance between the signal output terminal and the signal input terminal is longer than the redundant wiring length (RL2) of the signal line L2 having the longer distance between the terminals. Therefore, even when there is a difference in the distance between the signal output terminal and the signal input terminal, isometric wiring of the signal lines L1, L2 can be achieved and the performance of time-digital conversion can be improved.

FIG. 2 shows the case where the distance DL1 between the signal output terminal Q1 and the signal input terminal I1 is shorter than the distance DL2 between the signal output terminal Q2 and the signal input terminal I2, that is, DL1<DL2. However, the embodiment is not limited to this example. For example, the distance DL2 may be shorter than the distance DL1, that is, DL1>DL2. When DL1>DL2 holds, the signal lines L1, L2 are arranged in such a way that the wiring length RL2 of the second redundant wiring of the signal line L2 is longer than the wiring length RL1 of the first redundant wiring of the signal line L1. That is, the signal lines L1, L2 are arranged in such a way that DL1>DL2 and RL1<RL2 hold. Thus, even when there is a difference in the distance between the signal output terminal and the signal input terminal, isometric wiring of the signal lines L1, L2 can be achieved and the performance of time-digital conversion can be improved.

The positions of the signal output terminals Q1, Q2 are positions defined as the output terminals of the signals STA and STP in the circuit block of the AFE circuit 30, for example, the positions of the output terminals (output nodes) of the buffer circuit outputting the signals STA and STP. The positions of the signal input terminals I1, I2 are positions defined as the input terminals of the signals STA and STP in the circuit block of the time-to-digital converter 20, for example, the positions of the input terminals (input nodes) of the buffer circuit having the signals STA and STP inputted thereto.

In this embodiment, the signal lines L1 and L2 have the same number of changes in the wiring direction. That is, the signal lines L1, L2 are arranged in such a way as to have the same number of changes in the wiring direction. For example, in FIG. 1, the wiring direction of the signal line L1 changes at the sites of C1, C2, C3, and C4, and the wiring direction of the signal line L2 changes at the sites of D1, D2, D3, and D4. That is, the wiring direction of the signal line L1 changes by 90 degrees at the four corners C1, C2, C3, and C4. The wiring direction of the signal line L2 changes by 90 degrees at the four corners D1, D2, D3, and D4. Therefore, both of the signal lines L1 and L2 have four changes in the wiring direction, that is, the same number of changes in the wiring direction. The sheet resistance of the signal lines is different between the place where the wiring direction changes and the places where the wiring direction does not change and remains straight. Therefore, if the signal lines L1, L2 have difference numbers of changes in the wiring direction from each other, a difference is generated in wiring resistance (parasitic resistance) even when isometric wiring of the signal lines L1, L2 is achieved. Thus, this difference in wiring resistance causes a difference in the amount of signal delay, which causes an error in the time difference between the transition timings of the signals STA and STP. Particularly if there are a large number of changes in the wiring direction, this error is large, making it difficult to realize higher performance of time-digital conversion. In this respect, in the embodiment, the signal lines L1 and L2 are arranged in such a way as to have the same number of changes in the wiring direction. Thus, even when the sheet resistance is different between the places where the wiring direction changes and the places where the wiring direction does not change, the generation of a difference in the amount of signal delay due to the difference in sheet resistance can be prevented. This can prevent the generation of an error in the time difference between the transition timings of the signals STA and STP and can improve the performance of time-digital conversion.

Figure 4:
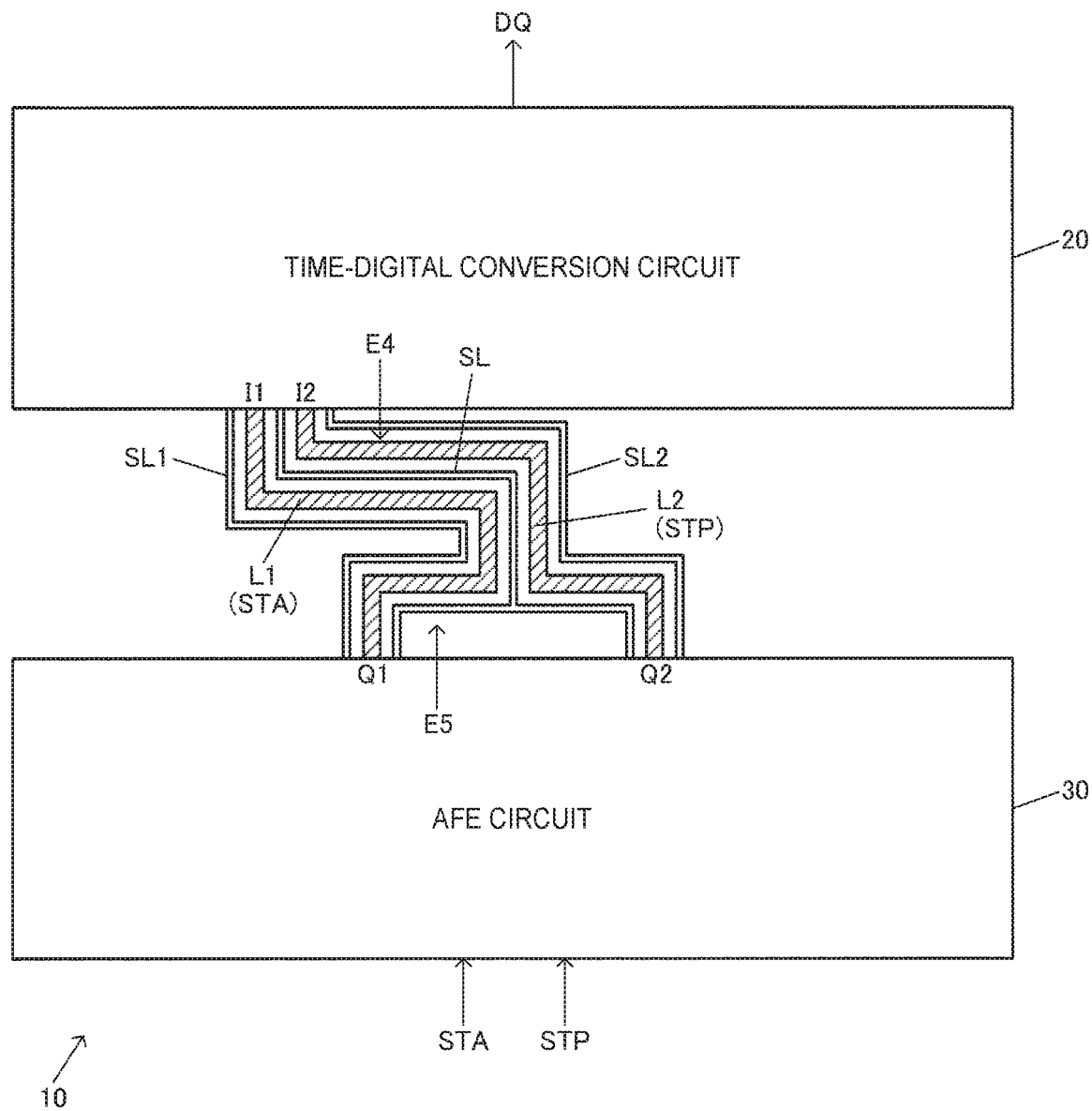
FIG. 4 is an explanatory view of a wiring method for a shield line.

In this embodiment, a shield line to restrain the superimposition of a signal noise on the signals STA and STP transmitted via the signal lines L1, L2 is arranged. For example, in FIG. 4, a shield line SL is arranged between the signal lines L1, L2. More specifically, shield lines SL, SL1 are arranged on both sides of the signal line L1, and shield lines SL, SL2 are arranged on both sides of the signal line L2. These shield lines SL, SL1, SL2 are set, for example, to a predetermined electric potential (ground potential GND or the like). In this embodiment, as shown in FIG. 4, at a part indicated by E4, which is a wiring part on the near side from the time-to-digital converter 20 of the wiring part of the signal lines L1, L2, the signal lines L1, L2 are arranged parallel to each other with the shield line SL provided between them. The parallel arrangement refers to, for example, arranging two signal lines parallel (substantially parallel) to each other. For example, the signal lines L1, L2 are arranged parallel (substantially parallel) to the shield line SL. Thus, the shield line SL can restrain the transmission of a signal noise of one signal line of the signal lines L1, L2 to the other signal line and therefore can improve the performance of time-digital conversion.

In this embodiment, at a part indicated by E5, which is a wiring part on the far side from the time-to-digital converter 20 of the wiring part of the signal lines L1, L2, at least one of the signal lines L1, L2 has redundant wiring. For example, in FIG. 4, the signal line L1 has redundant wiring at the part indicated by E5. Alternatively, both of the signal lines L1, L2 may have redundant wiring, as shown in FIG. 2. Thus, after the redundant wiring is provided at the wiring part on the far side from the time-to-digital converter 20, the signal lines L1, L2 can be arranged parallel to each other with the shield line SL provided between them at the wiring part on the near side from the time-to-digital converter 20. This makes it possible to provide efficient signal wiring while reducing the adverse effects of signal noises. For example, in FIG. 4, the signal lines L1, L2 from the signal output terminals Q1, Q2 of the AFE circuit 30 are arranged in such a way as to approach each other toward the vicinity of the center between the signal output terminals Q1, Q2. For example, in FIG. 4, the signal line L1 is arranged to the right from the signal output terminal Q1 and the signal line L2 is arranged to the left from the signal output terminal Q2. In this case, redundant wiring is provided as indicated by E5. After approaching each other at a place near the center between the signal output terminals Q1, Q2, the signal lines L1, L2 are arranged parallel to each other with the shield line SL provided between them and are connected to the signal input terminals I1, I2 of the time-to-digital converter 20. Thus, the shield line SL can restrain the transmission of a signal noise from one signal line to the other signal line. The wiring part on the near side from the time-to-digital converter 20 is the wiring part demarcated on the near side, for example, when the wiring part of the signal lines L1, L2 is divided into sections on the near side and the far side from the time-to-digital converter 20. The wiring part on the far side from the time-to-digital converter 20 is the wiring part demarcated on the far side from the time-to-digital converter 20.

Figure 5:
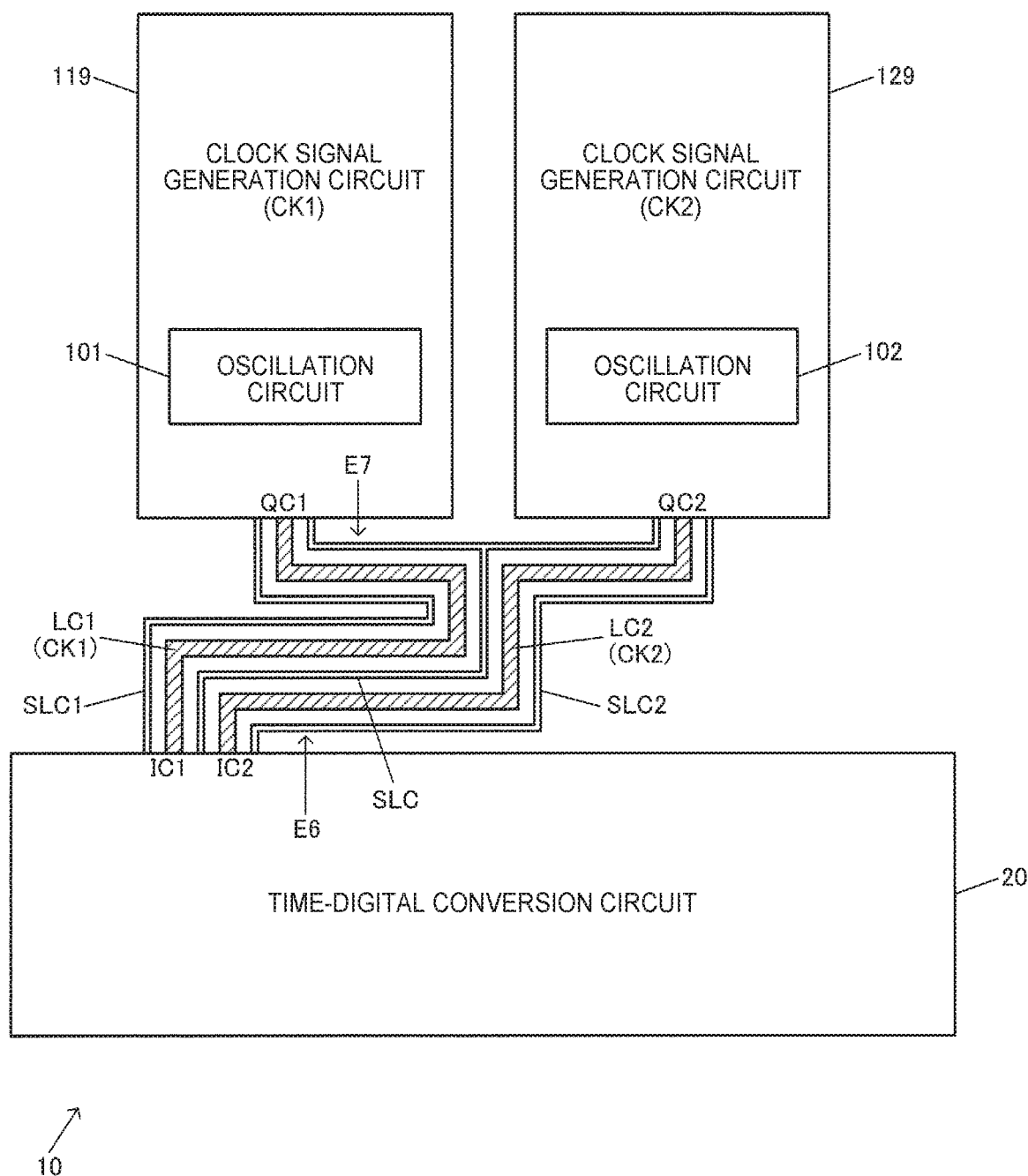
FIG. 5 is an explanatory view of a wiring method for signal lines between a clock signal generation circuit and a time-to-digital converter.

In this embodiment, as shown in FIG. 5, the integrated circuit device 10 can include clock signal generation circuits 119, 129. The clock signal generation circuit 119 (first clock signal generation circuit) has an oscillation circuit 101 and causes the oscillation circuit 101 to oscillate an resonator XTAL1 (first resonator) shown in FIG. 9, described later, and outputs a clock signal CK1 (first clock signal) thus generated. The clock signal generation circuit 129 (second clock signal generation circuit) has an oscillation circuit 102 (second oscillation circuit), causes the oscillation circuit 102 to oscillate an resonator XTAL2 (second resonator), and outputs a clock signal CK2 (second clock signal) thus generated. Carrying out time-digital conversion using the clock signals CK1, CK2 generated by such resonators XTAL1, XTAL2 can improve the performance of time-digital conversion, compared with a technique simply using a delay element of a semiconductor element. Particularly, using quartz crystal resonators as the resonators XTAL1, XTAL2 is advantageous in that changes in the clock frequencies of the clock signals CK1, CK2 due to environmental changes such as temperature change can be minimized.

The clock signal generation circuit 119 outputs the clock signal CK1 to a clock signal line LC1 (first clock signal line). For example, the clock signal generation circuit 119 outputs the clock signal CK1 from a signal output terminal QC1. The clock signal generation circuit 129 outputs the clock signal CK2 to a clock signal line LC2 (second clock signal line). For example, the clock signal generation circuit 129 outputs the clock signal CK2 from a signal output terminal QC2. The time-to-digital converter 20 has the clock signal CK1 inputted thereto from the clock signal generation circuit 119 via the clock signal line LC1 and has the clock signal CK2 inputted thereto from the clock signal generation circuit 129 via the clock signal line LC2. For example, the time-to-digital converter 20 has the clock signal CK1 inputted to a signal input terminal IC1, has the clock signal CK2 inputted to a signal input terminal IC2, and carries out time-digital conversion based on the inputted clock signals CK1, CK2.

In this embodiment, at least one of the clock signal lines LC1, LC2 has redundant wiring for isometric wiring. This can restrain a decline in the performance of time-digital conversion due to the parasitic resistances or parasitic capacitances of the clock signal lines. One signal line of the clock signal lines LC1, LC2 has a longer redundant wiring length than the other signal line. For example, at least one of the clock signal lines LC1, LC2 has redundant wiring to achieve isometric wiring of the clock signal lines LC1, LC2. The wiring length of the redundant wiring is longer in the one signal line than in the other signal line. For example, in FIG. 5, LC1 is the one clock signal line and LC2 is the other clock signal line. The clock signal line LC1 has redundant wiring for isometric wiring as indicated by E7 in FIG. 5 and has a longer redundant wiring length than clock signal line LC2. Forming the redundant wiring as indicated by E7 in the clock signal line LC1 enable isometric wiring of the clock signal lines LC1, LC2. This can restrain the generation of a difference between the amounts of signal delay of the clock signals CK1, CK2 due to the parasitic resistances or parasitic capacitances of the clock signal lines and therefore can restrain a decline in the performance of time-digital conversion. For example, in this embodiment, an inter-clock time difference TR of the clock signals CK1, CK2 is increased by $\Delta t$ each in each clock cycle, for example, to $\Delta t$, $2\Delta t$, $3\Delta t$, and the like, thus implementing time-digital conversion, as will be described later with reference to FIGS. 12 and 13. A difference generated between the amounts of signal delay of the clock signals CK1, CK2 due to the parasitic resistances or parasitic capacitances of the clock signal lines causes an error in the inter-clock time difference TR and reduces the performance of time-digital conversion. In this respect, in this embodiment, at least one of the clock signal lines LC1, LC2 has redundant wiring for isometric wiring. Also, for example, one clock signal line has a longer redundant wiring length than the other clock signal line. Thus, isometric wiring of the clock signal lines LC1, LC2 can be provided and the parasitic resistances and parasitic capacitances of the clock signal lines LC1, LC2 can be equalized. This can prevent the generation of an error in the inter-clock time difference TR due to the parasitic resistances or parasitic capacitances of the clock signal lines and can improve the performance of time-digital conversion.

Also, in this embodiment, the distance between the signal output terminal of the clock signal generation circuit 119, 129 and the signal input terminal of the time-to-digital converter 20 is shorter in one clock signal line than in the other clock signal line. For example, in FIG. 5, the distance DLC1 between the signal output terminal QC1 of the clock signal generation circuit 119 and the signal input terminal IC1 of the time-to-digital converter 20 is shorter than the distance DLC2 between the signal output terminal QC2 of the clock signal generation circuit 129 and the signal input terminal IC2 of the time-to-digital converter 20. In this case, in this embodiment, the redundant wiring length of the clock signal line where the distance between the signal output terminal and the signal input terminal is shorter is made longer. For example, in FIG. 5, since the distance DLC1 in the clock signal line LC1 is shorter than the distance DLC2 in the clock signal line LC2, the redundant wiring length of the clock signal line LC1 on the distance DLC1 side is made longer. This makes it possible to achieve isometric wiring of the clock signal lines even when the distance between the signal output terminal and the signal input terminal is different between the clock signal lines. This can restrain the generation of an error in the inter-clock time difference TR and thus can improve the performance of time-digital conversion.

In this embodiment, the clock signal lines LC1, LC2 are arranged in such a way as to have the same number of changes in the wiring direction. Therefore, with the same number of changes in the wiring direction, the generation of a difference in the amount of signal delay due to the difference in sheet resistance can be prevented, even when the sheet resistance is different between the places where the wiring direction changes and the places where the wiring direction does not change. This can prevent the generation of an error in the inter-clock time difference TR and can improve the performance of time-digital conversion.

In this embodiment, as shown in FIG. 5, the clock signal lines LC1 and LC2 are arranged parallel to each other with a shield line SLC provided between them, at a part indicated by E6, which is a wiring part on the near side from the time-to-digital converter 20 of the wiring part of the clock signal lines LC1, LC2. Thus, the shield line SLC can restrain the transmission of a clock noise from one clock signal line of the clock signal lines LC1, LC2 to the other clock signal line and thus can improve the performance of time-digital conversion. Also, in this embodiment, at least one of the clock signal lines LC1, LC2 is arranged with redundant wiring at a part indicated by E7, which is a wiring part on the far side from the time-to-digital converter 20 of the wiring part of the clock signal lines LC1 and LC2. For example, in FIG. 5, the clock signal line LC1 is arranged with redundant wiring. Alternatively, the clock signal line LC2 may be arranged with redundant wiring or both of the clock signal lines LC1, LC2 may be arranged with redundant wiring. Thus, after the redundant wiring is provided at the wiring part on the far side from the time-to-digital converter 20, the clock signal lines LC1, LC2 can be arranged parallel to each other with the shield line SLC provided between them, at the wiring part on the near side from the time-to-digital converter 20. This makes it possible to provide efficient signal wiring while reducing the adverse effects of noises. For example, in FIG. 5, the clock signal lines LC1, CL2 from the signal output terminals QC1, QC2 of the clock signal generation circuits 119, 129 are arranged in such a way was to approach each other toward the vicinity of the center between the signal output terminals QC1, QC2. For example, in FIG. 5, the clock signal line LC1 is arranged to the right from the signal output terminal QC1 and the clock signal line LC2 is arranged to the left from the signal output terminal QC2. In this case, redundant wiring is provided as indicated by E7. After the clock signal lines LC1, LC2 approach each other at a place near the center between the signal output terminals QC1, QC2, the clock signal lines LC1, LC2 are arranged parallel to each other with the shield line SLC provided between them, and are connected to the signal input terminals IC1, IC2 of the time-to-digital converter 20. Thus, the shield line SLC can restrain the transmission of a clock noise from one clock signal line to the other clock signal line.

In FIG. 6, the time-to-digital converter 20 includes time-digital conversion units TDC1 to TDC4 (first to n-th time-digital conversion units). Details of the time-digital conversion units TDC1 to TDC4 will be described later with reference to FIG. 10. Based on a start signal, which is the signal STA, the AFE circuit 30 outputs start signals STA1 to STA4 whose waveforms are shaped (first to n-th start signals, with n being an integer equal to or greater than 2) to start signal lines LA1 to LA4 (first to n-th start signal lines). For example, the AFE circuit 30 causes a comparator to compare the voltage level of the signal STA with a predetermined threshold voltage and causes a plurality of buffer circuit to buffer an output signal from the comparator, thus outputting the start signals STA1 to STA4 to the start signal lines LA1 to LA4. Also, based on a stop signal, which is the signal STP, the AFE circuit 30 outputs stop signals STP1 to STP4 whose waveforms are shaped (first to n-th stop signals) to stop signal lines LP1 to LP4 (first to n-th stop signal lines) For example, the AFE circuit 30 causes a plurality of comparators to compare the signal STP with a plurality of threshold voltages and causes a plurality of buffer circuits to buffer output signals from the plurality of comparators, thus outputting the stop signals STP1 to STP4 to the stop signal lines LP1 to LP4. That is, the AFE circuit 30 outputs the start signals STA1 to STA4 whose waveforms are shaped from signal output terminals QA1 to QA4 (first to n-th start signal output terminals), based on the start signal (STA), and outputs the stop signals STP1 to STP4 whose waveforms are shaped to signal output terminals QP1 to QP4 (first to n-th stop signal output terminals), based on the stop signal (STP).

The time-to-digital converter 20 has the start signals STA1 to STA4 inputted thereto from the AFE circuit 30 via the start signal lines LA1 to LA4 and has the stop signals STP1 to STP4 inputted thereto from the AFE circuit 30 via the stop signal lines LP1 to LP4. That is, the time-to-digital converter 20 has the start signals STA1 to STA4 from the AFE circuit 30 inputted thereto from signal input terminals IA1 to IA4 and has the stop signals STP1 to STP4 from the AFE circuit 30 inputted thereto from signal input terminals IP1 to IP4.

The time-to-digital converter 20 carries out time-digital conversion based on the start signals STA1 to STA4 and the stop signals STP1 to STP4 inputted thereto. For example, the time-to-digital converter 20 carries out time-digital conversion to convert the time difference between the transition timings of the start signal STA1 and the stop signal STP1 into a digital value and outputs DQ1. The time-digital conversion unit TDC1 carries out this time-digital conversion. Similarly, the time-to-digital converter 20 carries out time-digital conversion to convert the time differences between the transition timings of STA2 and STP2, STA3 and STP3, and STA4 and STP4 into digital values and outputs DQ2, DQ3, and DQ4. The time-digital conversion units TDC2, TDC3, TDC4 carry out these time-digital conversions. The time-to-digital converter 20 finds an ultimate digital value DQ, which is the time difference between the transition timings of the signals STA and STP, based on the output values DQ1 to DQ4.

In this embodiment, of the first to n-th stop signal lines (LP1 to LP4), the j-th stop signal line has a longer redundant wiring length than the k-th stop signal line ($1 \le j \le n$, $1 \le k \le n$, $j \ne k$). For example, the j-th stop signal line and the k-th stop signal line are arranged as isometric wiring. Similarly, of the first to n-th start signal lines (LA1 to LA4), the j-th start signal line has a longer redundant wiring length than the k-th start signal line. For example, the j-th start signal line and the k-th start signal line are arranged as isometric wiring. Specifically, the integrated circuit device 10 according to this embodiment includes the first to n-th start signal lines (LA1 to LA4) connecting the first to n-th signal output terminals (QA1 to QA4) and the first to n-th signal input terminals (IA1 to IA4), and the first to n-th stop signal lines (LP1 to LP4) connecting the first to n-th signal output terminals (QP1 to QP4) and the first to n-th signal input terminals (IP1 to IP4). The j-th stop signal line has j-th redundant wiring. The k-th stop signal line has k-th redundant wiring. The distance between the j-th stop signal output terminal and the j-th stop signal input terminal is shorter than the distance between the k-th stop signal output terminal and the k-th stop signal input terminal. The j-th redundant wiring is longer than the k-th redundant wiring.

For example, in FIG. 6, the stop signal line LP3 (in a broad sense, the j-th stop signal line) has longer redundant wiring than the stop signal line LP4 (in a broad sense, the k-th stop signal line). Specifically, the distance between the signal output terminal QP3 (in a broad sense, the j-th stop signal output terminal) and the signal input terminal IP3 (in a broad sense, the j-th stop signal input terminal) is shorter than the distance between the signal output terminal QP4 (in a broad sense, the k-th stop signal output terminal) and the signal input terminal IP4 (in a broad sense, the k-th stop signal input terminal). The redundant wiring of the stop signal line LP3 (j-th redundant wiring) is longer than the redundant wiring of the stop signal line LP4 (k-th redundant wiring). For example, the stop signal line LP3 has redundant wiring as indicated by F1. The redundant wiring length of the stop signal line LP3 is made longer than that of the stop signal line LP4, thus realizing isometric wiring of the stop signal lines LP3 and LP4. Similarly, the start signal line LA3 (in abroad sense, the j-th start signal line) has longer redundant wiring than the start signal line LA4 (in a broad sense, the k-th start signal line), thus realizing isometric wiring of the start signal lines LA3 and LA4.

The stop signal line LP2 (j-th stop signal line) has longer redundant wiring than the stop signal line LP3 (k-th stop signal line). Specifically, the distance between the signal output terminal QP2 (j-th stop signal output terminal) and the signal input terminal IP2 (j-th stop signal input terminal) is shorter than the distance between the signal output terminal QP3 (k-th stop signal output terminal) and the signal input terminal IP3 (k-th stop signal input terminal). The redundant wiring of the stop signal line LP2 (j-th redundant wiring) is longer than the redundant wiring of the stop signal line LP3 (k-th redundant wiring). Similarly, the start signal line LA2 (j-th start signal line) has longer redundant wiring than the start signal line LA3 (k-th start signal line). For example, while the signal lines LP3, LA3 have the redundant wiring (k-th redundant wiring) indicated by F1, the signal lines LP2, LA2 have longer redundant wiring (j-th redundant wiring) as indicated by F2, F3, F4. This provides isometric wiring of the signal lines LP2 and LP3, and LA2 and LA3. Also, while the signal lines LP2, LA2 have the redundant wiring indicated by F2, F3, F4, the signal lines LP1, LA1 have longer redundant wiring as indicated by F5, F6, F7. This provides isometric wiring of the signal lines LP1 and LP2, and LA1 and LA2.

In this way, in FIG. 6, when the AFE circuit 30 and the time-to-digital converter 20 are connected to each other via the plurality of stop signal lines (LP1 to LP4) and the plurality of start signal lines (LA1 to LA4), the plurality of stop signal lines and the plurality of start signal lines are arranged in such a way as to achieve isometric wiring. That is, adjusting the length of redundant wiring enables isometric wiring of the plurality of stop signal lines and the plurality of start signal lines. For example, the redundant wiring in the stop signal line or start signal line where the distance between the signal output terminal (QA1 to QA4, QP1 to QP4) and the signal input terminal (IA1 to IA4, IP1 to IP4) is shorter is made longer than in the stop signal line or start signal line where that distance is longer. Thus, isometric wiring of the plurality of stop signal lines or isometric wiring of the plurality of start signal lines can be realized even in the connection configuration as shown in FIG. 6. Also, isometric wiring of each stop signal line and each start signal line can be realized. For example, in a technique of carrying out time-digital conversion using the stop signals STP1 to STP4 generated by comparing the voltage level of the signal STP with a plurality of threshold voltages and using the start signals STA1 to STA4, as will be described later, slope information of the signal STP is specified and the ultimate digital value DQ is thus found. In this case, providing isometric wiring of the stop signal lines LP1 to LP4 and the start signal lines LA1 to LA4 can reduce the adverse effects of the parasitic resistances and parasitic capacitances of these signal lines. This makes it possible to specify more accurate slope information to find the ultimate digital value DQ and thus improve the performance of time-digital conversion.

2. Example of Layout of Integrated Circuit Device

FIG. 7 shows an example of the layout of the integrated circuit device 10. The integrated circuit device 10 includes a terminal region 40, the AFE circuit 30, and the time-to-digital converter 20. The integrated circuit device 10 can also include the clock signal generation circuits 119, 129, an oscillation circuit 103, terminal regions 41, 42, logic circuits 44, 45, 46, and an I/F circuit 47. In FIG. 7, a direction from a side SD1 (first side) of the integrated circuit device 10 (semiconductor chip) to the opposite side SD2 (second side) is defined as DR1 (first direction). A direction intersecting (orthogonal to) the direction DR1 is defined as DR2 (second direction). A direction intersecting (orthogonal to) the directions DR1 and DR2 is defined as DR3 (third direction). The opposite direction of DR1 is defined as DR4 (fourth direction). The opposite direction of DR2 is defined as DR5 (fifth direction). DR1 is a direction along the sides SD3, SD4 (third and fourth sides) of the integrated circuit device 10. DR2 is a direction along the sides SD1, SD2 of the integrated circuit device 10. DR3 is a direction intersecting (orthogonal to) to the substrate (semiconductor substrate) of the integrated circuit device 10. Also, DR2 may be the left direction and DR5 may be the right direction.

In the terminal region 40 (I/O region), a signal terminal PSA (first signal terminal) for the signal STA (first signal) and a signal terminal PSP (second signal terminal) for the signal STP (second signal) are arranged. A terminal for power supply (VDD, VSS) or the like may also be arranged in the terminal region 40. These signal terminals PSA, PSP are, for example, pads of the IC, which is the integrated circuit device 10. The terminal region 40 is also a region including a plurality of terminals and provided along the side SD1 of the integrated circuit device 10. The longitudinal direction of the terminal region 40 is in the direction DR2. The integrated circuit device 10 also has the terminal region 41 along the side SD3 and the terminal region 42 along the side SD4. A plurality of terminals is arranged in the terminal regions 41, 42, too. The longitudinal direction of the terminal regions 41, 42 is in the direction DR1.

When the direction from the side SD1 to the opposite side SD2 of the integrated circuit device 10 is DR1, the AFE circuit 30 is arranged on the direction DR1 side (first direction side) of the terminal region 40. The time-to-digital converter 20 is arranged at least one of the direction DR1 side of the AFE circuit 30 and a direction side intersecting the direction DR1. The direction side intersecting the direction DR1 is at least one of the DR2 side and the DR5 side, which is opposite to DR2. In FIG. 7, the time-to-digital converter 20 is arranged on the direction DR1 side of the AFE circuit 30. For example, the AFE circuit 30 is arranged between the terminal region 40, where the signal terminals PSA, PSP are arranged, and the time-to-digital converter 20. For example, the terminal region 40 and the AFE circuit 30 are arranged next to each other in the direction DR1. The AFE circuit 30 and the time-to-digital converter 20 are arranged next to each other in the direction DR1. Being arranged next to each other is being arranged without any circuit block (circuit element) provided between them. A circuit block is, for example, a region having a predetermined area where a plurality of circuit elements (transistors or the like) is arranged.

With the arrangement configuration of FIG. 7, for example, the distance between the terminal region 40 and the AFE circuit 30 can be made short. Thus, the signal lines for the signals STA, STP from the signal terminals PSA, PSP can be connected in a short path to the AFE circuit 30. Also, the distance between the AFE circuit 30 and the time-to-digital converter 20 can be made short. Thus, the signal lines for the signals STA, STP after waveform shaping from the AFE circuit can be efficiently connected to the time-to-digital converter 20. This can restrain a decline in the performance of time-digital conversion due to the parasitic resistances or parasitic capacitances of the signal lines and can improve the performance (accuracy, resolution) of time-digital conversion. For example, in the wiring region between the AFE circuit 30 and the time-to-digital converter 20, the signal lines can be arranged by the technique described with reference to FIGS. 1 to 4 and FIG. 6. This can restrain a decline in the performance of time-digital conversion due to the parasitic resistances or parasitic capacitances of the signal lines and can improve the performance of time-digital conversion.

For example, in the related-art technique disclosed in JP-A-5-87954, a circuit for waveform shaping of a stop pulse or start pulse is not provided. Therefore, time-digital conversion is carried out using a signal having a rounded waveform. This makes it difficult to improve the performance of time-digital conversion. In contrast, in this embodiment, the AFE circuit 30 performing waveform shaping is provided in the integrated circuit device 10. Therefore, the signals STA, STP from the signal terminals PSA, PSP can be inputted to the time-to-digital converter 20, after having their waveforms shaped. This enables time-to-digital converter 20 to carry out time-digital conversion using a signal having a waveform close to a square wave, and thus can improve the performance of time-digital conversion. Also, in the related-art technique disclosed in JP-A-5-87954, each circuit block is implemented by discrete circuit components and therefore the circuit blocks are connected to each other via the wiring on the circuit board. This increases the parasitic resistances and parasitic capacitances of the signal lines and thus lowers the performance of time-digital conversion. In contrast, in this embodiment, the AFE circuit 30 and the time-to-digital converter 20 are integrated in the integrated circuit device 10. Therefore, circuit blocks such as the AFE circuit 30 and the time-to-digital converter 20 can be laid out and arranged closely to each other in the integrated circuit device 10 as a semiconductor chip. This can reduce the adverse effects of the parasitic resistance or parasitic capacitance between the circuit blocks and can improve the performance of time-digital conversion, compares with the related-art technique disclosed.

In FIG. 7, PLL circuits 120, 130 are provided as the clock signal generation circuits 119, 129 of FIG. 5. The PLL circuit 120 (first PLL circuit) includes the oscillation circuit 101 and a control signal generation circuit 121 (first control signal generation circuit) which outputs to the oscillation circuit 101 a control signal to control the oscillation frequency. The PLL circuit 130 (second PLL circuit) includes the oscillation circuit 102 and a control signal generation circuit 131 which outputs to the oscillation circuit 102 a control signal to control the oscillation frequency. For example, the control signal outputted from the control signal generation circuits 121, 131 is a control voltage. The oscillation circuits 101, 102 are voltage-controlled oscillation circuits (VCO) having the oscillation frequency controlled by the control voltage. However, the control signal may be a digital signal. In this case, the oscillation circuits 101, 102 are circuits having the oscillation frequency controlled by the digital signal. The control signal may also be a control current. The oscillation circuits 101, 102 may be circuits having the oscillation frequency controlled by the control current. Using the PLL circuits 120, 130 as the clock signal generation circuits 119, 129 in this way can improve the accuracy of the clock signals CK1, CK2. For example, the phases of the clock signals CK1, CK2 can be synchronized and a predetermined frequency relation or phase relation can be maintained between the clock signals CK1, CK2. This can further improve the performance of time-digital conversion. The PLL circuits 120, 130 will be described in detail later with reference to FIG. 14.

In FIG. 7, the PLL circuits 120, 130 (first and second clock signal generation circuits) are arranged on the direction DR1 side of the time-to-digital converter 20. For example, the time-to-digital converter 20 is arranged between the AFE circuit 30 and the PLL circuits 120, 130. For example, the PLL circuits 120, 130 and the time-to-digital converter 20 are arranged next to each other without any circuit block provided between them. This can realize a short distance between the PLL circuits 120, 130 and the time-to-digital converter 20. Thus, the clock signal lines for the clock signals CK1, CK2 from the PLL circuits 120, 130 can be efficiently connected to the time-to-digital converter 20. For example, in the wiring region between the PLL circuits 120, 130 and the time-to-digital converter 20, the clock signal lines can be arranged by the technique described with reference to FIG. 5. This can restrain a decline in the performance of time-digital conversion due to the parasitic resistances or parasitic capacitances of the clock signal lines and thus can improve the performance of time-digital conversion.

Figure 9:
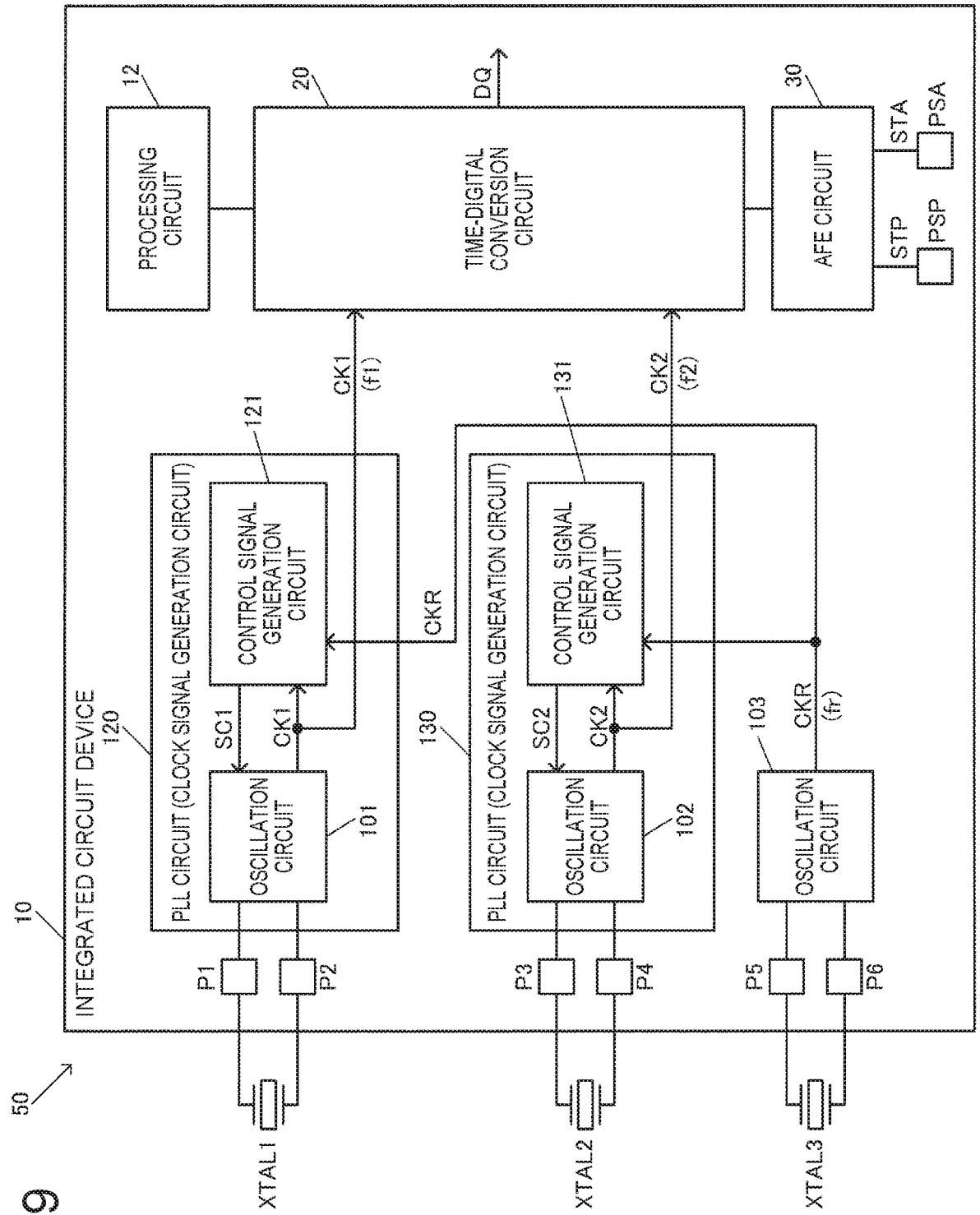
FIG. 9 shows an example of the configuration of the integrated circuit device and a physical quantity measuring device according to the embodiment.
Figure 18:
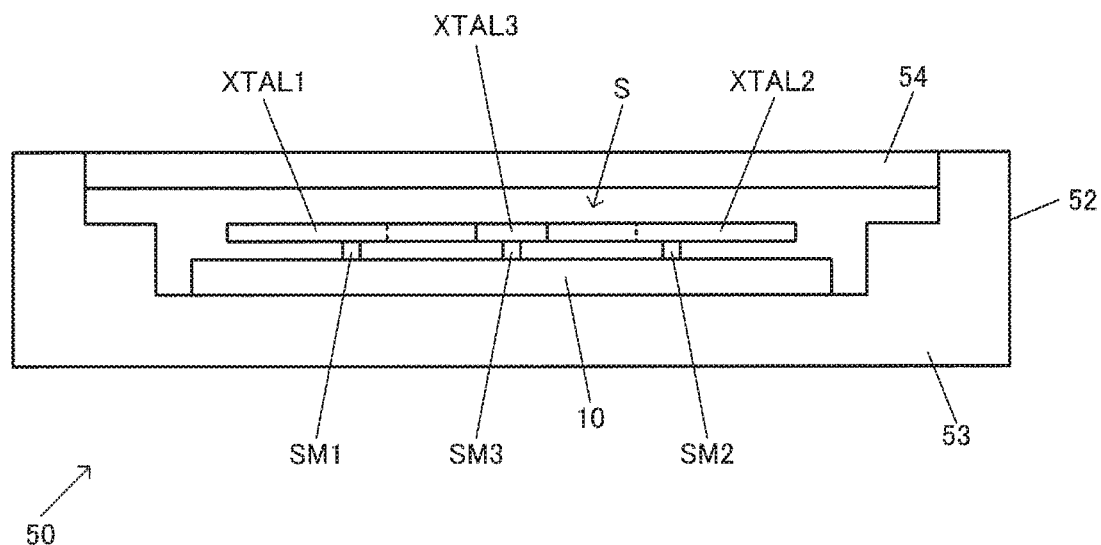
FIG. 18 shows a configuration example of the physical quantity measuring device according to the embodiment.

The integrated circuit device 10 also includes the oscillation circuit 103 (third oscillation circuit), which generates a reference clock signal CKR by oscillating an resonator XTAL3 (third resonator) shown in FIG. 9, described later. The PLL circuit 120 generates the clock signal CK1 whose phase is synchronized with that of the reference clock signal CKR. The PLL circuit 130 generates the clock signal CK2 whose phase is synchronized with that of the reference clock signal CKR. As the phases of the clock signals CK1, CK2 are synchronized with that of the reference clock signal CKR, the phases of the clock signals CK1, Ck2 are synchronized with each other. This makes it possible to maintain a predetermined frequency relation or phase relation between the clock signals CK1, CK2. The oscillation circuit 103 is arranged on the direction DR1 side of the PLL circuits 120, 130. This enables the PLL circuits 120, 130 to receive the reference clock signal CKR from the oscillation circuit 103 located on the direction DR1 side, generate the clock signals CK1, CK2, and supply the generated clock signals CK1, CK2 to the time-to-digital converter 20 located on the direction DR4 side, which is opposite to DR1. Also, in the case of installing the resonators XTAL1, XTA12, XTAL3 on the integrated circuit device 10 as shown in FIG. 18, described later, the resonator XTAL3 connected to the oscillation circuit 103 can be loaded above the oscillation circuit 103 arranged on the direction DR1 side of the PLL circuits 120, 130.

The logic circuits 44, 45 carry out various kinds of processing and are implemented by, for example, automatic placement and routing of gate arrays or the like. The I/F circuit 47 is a circuit which carries out interface processing via communication with an external device. For example, the I/F circuit 47 carries out high-speed serial interface processing based on a differential signal with a low amplitude such as PECL (positive emitter-coupled logic) or LVDS (low-voltage differential signaling). With the I/F circuit 47, it is possible to monitor the clock frequencies of the clock signals CK1, CK2 and the reference clock signal CKR. The integrated circuit device 10 is also provided with terminals P1, P2 (first oscillation terminal, second oscillation terminal) connected to the oscillation circuit 101 and terminals P3, P4 (third oscillation terminal, fourth oscillation terminal) connected to the oscillation circuit 102. The integrated circuit device 10 is also provided with terminals P5, P6 (fifth oscillation terminal, sixth oscillation terminal) connected to the oscillation circuit 103.

In FIG. 7, regions R1, R2 (first region, second region) are regions of the integrated circuit device 10 demarcated by a reference line LNR along the direction DR1. The reference line LNR is an imaginary line, for example, passing through the center of the integrated circuit device 10. In this case, the PLL circuit 120 is arranged in the region R1 demarcated by the reference line LNR. The PLL circuit 130 is arranged in the region R2 demarcated by the reference line LNR. For example, the PLL circuits 120, 130 are arranged in line symmetry about the reference line LNR as the axis of symmetry. Thus, in the case of installing the resonators XTAL1, XTAL2 on the integrated circuit device 10, the resonator XTAL1 and the PLL circuit 120 can be arranged in the region R1, and the resonator XTAL2 and the PLL circuit 130 can be arranged in the region R2. This can achieve an efficient layout of the integrated circuit device 10 and efficient loading and placement of the resonators XTAL1, XTAL2 onto the integrated circuit device 10. Also, in FIG. 7, the time-to-digital converter 20 and the logic circuits 44, 46 are arranged in line symmetry about the reference line LNR as the axis of symmetry. The time-digital conversion units TDC1, TDC2 of the time-to-digital converter 20 and the signal terminal PSP for the signal STP are provided in the region R1. The time-digital conversion units TDC3, TDC4 of the time-to-digital converter 20 and the signal terminal PSA for the signal STA are provided in the region R2. Such a symmetrical layout can equalize, for example, the parasitic resistances and parasitic capacitances of the signal lines between the regions R1 and R2 and thus can improve the performance of time-digital conversion.

FIG. 8 shows another example of the layout of the integrated circuit device 10. For example, in FIG. 7, the time-digital conversion units TDC1 to TDC4 are arranged on the direction DR1 side of the AFE circuit 30. Meanwhile, in FIG. 8, two (K) time-digital conversion units TDC2, TDC3, of the time-digital conversion units TDC1 to TDC4, are arranged on the DR1 side of the AFE circuit 30, and the remaining two (L) time-digital conversion units TDC1, TDC4 are arranged on a direction side intersecting the direction DR1 of the AFE circuit 30. This enables effective use of not only the space on the direction DR1 side of the AFE circuit 30 but also the spaces on the DR2 side and the DR5 side intersecting the direction DR1, to arrange the time-to-digital converter 20. Also, a modification is possible in which some of the time-digital conversion units TDC1 to TDC4 are arranged with a circuit block provided between these time-digital conversion units and the AFE circuit 30.

3. Configuration Example of Integrated Circuit Device and Physical Quantity Measuring Device FIG. 9 shows a configuration example of the integrated circuit device 10 and a physical quantity measuring device 50 including the integrated circuit device 10. The integrated circuit device 10 includes the AFE circuit 30, the time-to-digital converter 20, and the PLL circuits 120, 130. The integrated circuit device 10 can also include the oscillation circuit 103, a processing circuit 12, the signal terminals PSA, PSP, and the terminals P1 to P6 for oscillation. The physical quantity measuring device 50 includes the resonators XTAL1 to XTAL 3 and the integrated circuit device 10.

The AFE circuit 30 carries out waveform shaping of signals STA, STP from the signal terminals PSA, PSP. The time-to-digital converter 20 converts the time difference between the transition timings of the signals STA, STP whose waveforms are shaped, into a digital value DQ. The oscillation circuit 103 carries out an oscillation operation to oscillate the resonator XTAL3 and thus generates a reference clock signal CKR with a clock frequency fr. The PLL circuits 120, 130 respectively generate clock signals CK1, CK2 whose phases are synchronized with that of the reference clock signal CKR. Specifically, the control signal generation circuit 121 of the PLL circuit 120 outputs to the oscillation circuit 101 a control signal SC1 based on the comparison of the phases of the clock signal CK1 from the oscillation circuit 101 and the reference clock signal CKR from the oscillation circuit 103, and thus synchronizes the phase of the clock signal CK1 with that of the reference clock signal CKR. Also, the control signal generation circuit 131 of the PLL circuit 130 outputs to the oscillation circuit 102 a control signal SC2 based on the comparison of the phases of the clock signal CK2 from the oscillation circuit 102 and the reference clock signal CKR from the oscillation circuit 103, and thus synchronizes the phase of the clock signal CK2 with that of the reference clock signal CKR. As the phases of the clock signals CK1, CK2 are synchronized with that of the reference clock signal CKR, the phases of the clock signals CK1, CK2 are synchronized with each other. This makes it possible to maintain a predetermined frequency relation or phase relation between the clock signals CK1, CK2. For example, if the clock frequencies of the clock signals CK1, CK2 are f1, f2, the PLL circuits 120, 130 (synchronization circuits, control units) carry out control to maintain the frequency relation of N/f1=M/f2 (where N, M are integers equal to or greater than 2 and different from each other). Using such clock signals CK1, CK2 enables the execution of time-digital conversion in which the clock signals CK1, CK2 are set in a proper frequency relation. Thus, high-performance time-digital conversion can be achieved. The processing circuit 12 carries out various kinds of processing such as control processing on the integrated circuit device 10 and computational processing. The processing circuit 12 is implemented by the logic circuits 44, 45, 46 or the like of FIGS. 7 and 8. The oscillation circuits 101, 102, 103 can include a power-supply circuit (regulator) which supplies electrical power for the oscillation circuit, or the like, in addition to circuit elements such as a buffer circuit, a resistor, and a capacitor.

Figure 10:
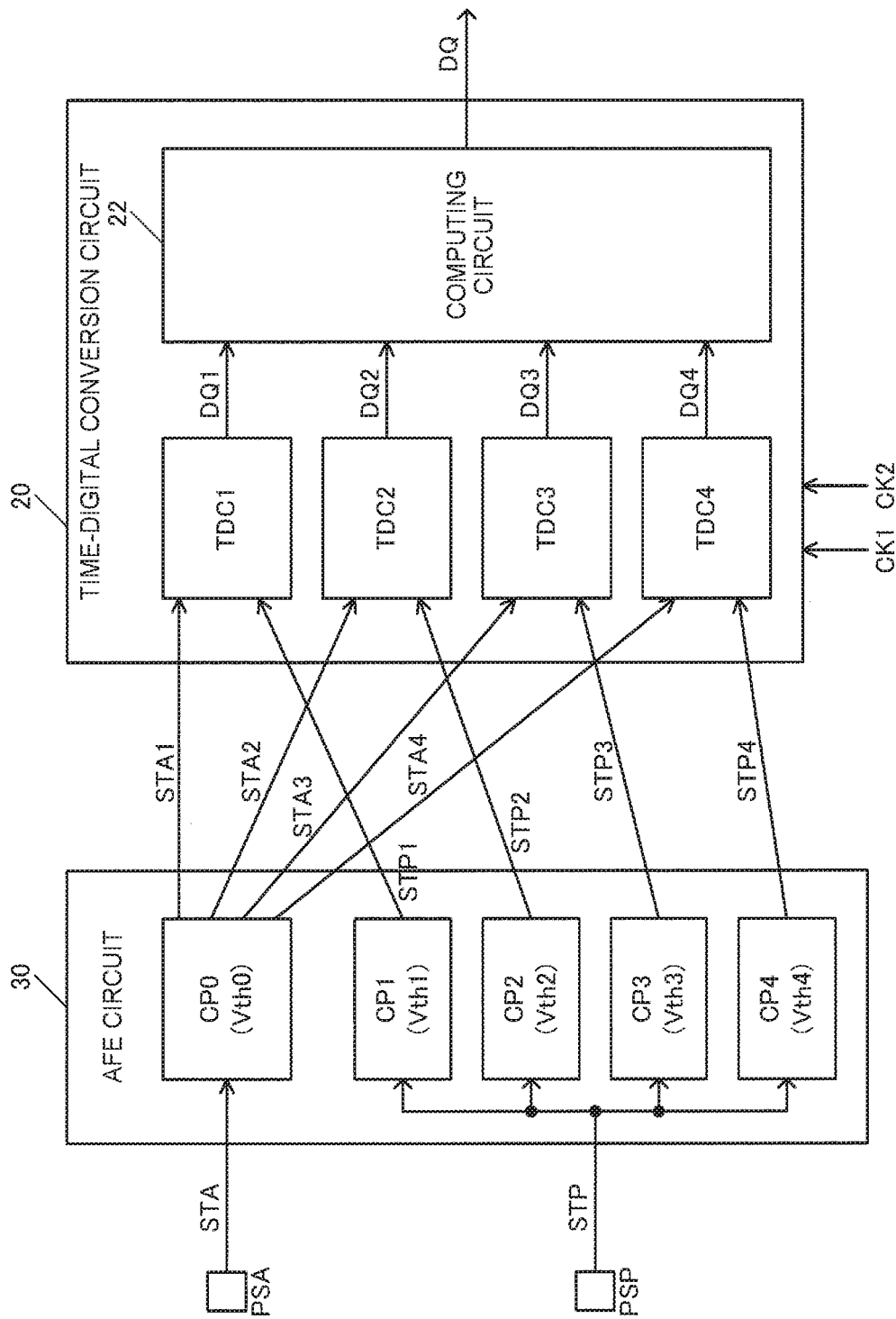
FIG. 10 shows a detailed configuration example of the AFE circuit and the time-to-digital converter.

FIG. 10 shows a detailed configuration example of the AFE circuit 30 and the time-to-digital converter 20. The AFE circuit 30 compares the voltage level of the signal STP (second signal, stop signal) with a plurality of threshold voltages Vth1 to Vth4 and thus outputs stop signals STP1 to STP4 (first to n-th stop signals). The STP1 to STP4 are stop signals whose waveforms are shaped. The AFE circuit 30 also outputs start signals STA1 to STA4 (first to n-th start signals) based on the signal STA (first signal, start signal). The STA1 to STA4 are start signals whose waveforms are shaped. In the case of a spontaneous type, the start signals STA1 to STA4 are generated inside the time-to-digital converter 20 instead of being inputted from the AFE circuit 30.

The AFE circuit 30 includes a comparison circuit CP0 (waveform shaping circuit) which has the signal STA inputted thereto and outputs the start signals STA1 to STA4, and comparison circuits CP1 to CP4 (waveform shaping circuits) which have the signal STP inputted thereto and output the stop signals STP1 to STP4. The comparison circuit CP0 includes a comparator which compares the voltage level of the signal STA with a threshold voltage Vth0, and first to fourth buffer circuits which buffer an output signal from the comparator and output the start signals STA1 to STA4. The comparison circuit CP1 includes a comparator which compares the voltage level of the signal STP with a threshold voltage Vth1, and a buffer circuit which buffers an output signal from the comparator and outputs the stop signals STP1. Similarly, the comparison circuits CP2, CP3, CP4 each include a comparator which compares the voltage level of the signal STP with a threshold voltage Vth2, Vth3, Vth4, and a buffer circuit which buffers an output signal from the comparator and outputs the stop signals STP2, STP3, STP4. The time-digital conversion unit TDC1 carries out processing to convert the time difference between the transition timings of the start signal STA1 and the stop signals STP1 into a digital value and thus outputs DQ1. Similarly, the time-digital conversion units TDC2, TDC3, TDC4 each carry out processing to convert the time difference between the transition timings of the start signal STA2, STA3, STA4 and the stop signal STP2, STP3, STP4 and thus output DQ2 to DQ4. The time-to-digital converter 20 includes a computation circuit 22. The computation circuit 22 carries out computational processing based on the output values DQ1 to DQ4 from the time-digital conversion units TDC1 to TDC4 and finds a digital value DQ corresponding to the time difference between the transition timings of the signals STA and STP.

The threshold voltages Vth1 to Vth4 (first to fourth threshold voltages) of the comparison circuits CP1 to CP4 are different voltages from each other. For example, the relation of Vth1<Vth2<Vth3<Vth4 holds. As the comparison circuits CP1 to CP4 thus compare the voltage of the signal STP with the threshold voltages Vth1 to Vth4, which are different from each other, slope information of the signal STP can be acquired. Thus, by carrying out computational processing based on the output values DQ1 to DQ4 from the time-digital conversion units TDC1 to TDC4, the computation circuit 22 can specify the accurate transition timing of the signal STP based on the slope information of the signal STP, and can find the digital value DQ corresponding to the time difference between the transition timings of the signals STA and STP. Such computational processing using the slope information is particularly effective for the signal STP inputted from a receiving device such as a light receiving unit, because this signal STP has a more rounded waveform than the signal STA.

4. Time-Digital Conversion

Figure 11:
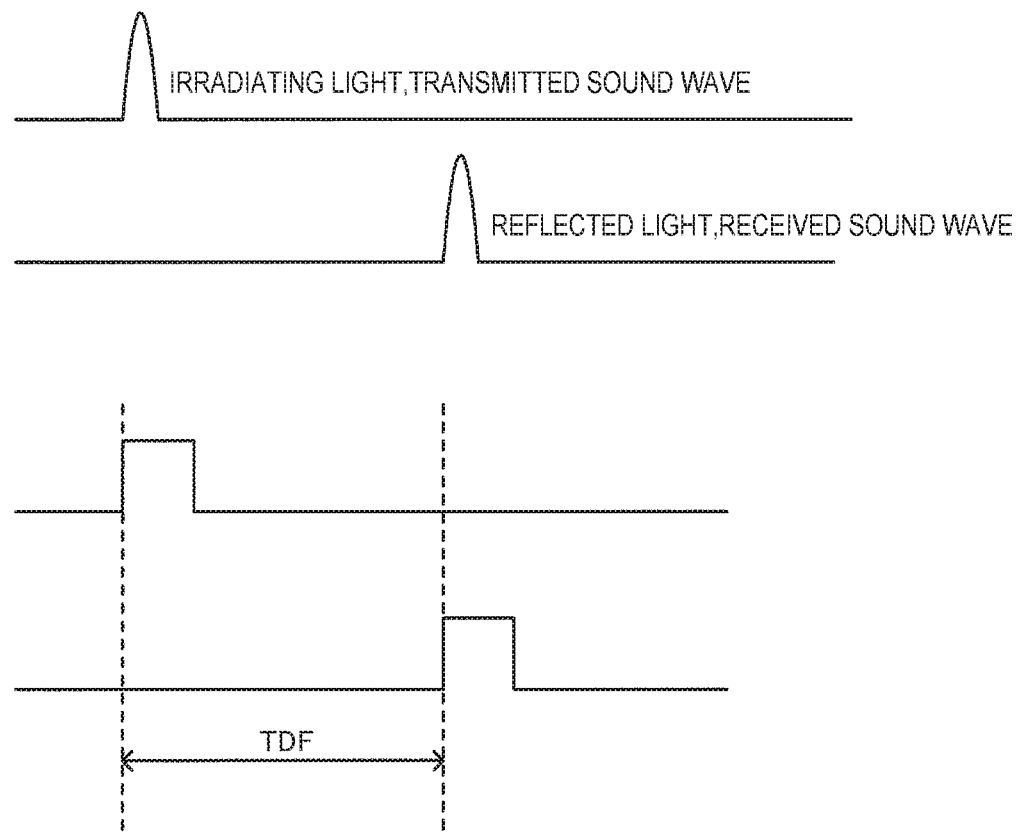
FIG. 11 shows physical quantity measurement using signals STA, STP.

Next, a detailed example of time-digital conversion will be described. FIG. 11 shows the relation between the signal STA (start signal) and the signal STP (stop signal). The time-to-digital converter 20 converts the time difference TDF between the transition timings of the signals STA and STP into a digital value DQ. While FIG. 11 shows that the TDF is the time difference between the rise transition timings (rising edges) of the signals STA and STP, it may be the time difference between the fall transition timings (falling edges) of the signals STA and STP. For example, in this embodiment, irradiating light (for example, a laser beam) is emitted to a target object (for example, an object around a car), using the signal STA, as shown in FIG. 11. Based on the reception of the reflected light from the target object, the signal STP is generated. For example, the waveform of a light receiving signal is shaped to generate the signal STP. Thus, by converting the time difference TDF between the transition timings of the signals STA and STP into a digital value DQ, it is possible to measure the distance from the target object as a physical quantity, for example, by a time-of-flight (TOF) method and to use the physical quantity, for example, for automatic driving of a car or operation control of a robot or the like. Alternatively, in this embodiment, transmitted sound waves (for example, ultrasound) are transmitted to a target object (for example, a living body), using the signal STA. Based on the reception of received sound waves from the target object, the signal STP is generated. This makes it possible to measure the distance or the like from the target object and thus measure biological information via ultrasound. In FIG. 11, transmission data may be transmitted via the signal STA, and the signal STP based on the reception of reception data may be used to measure the time from when the transmission data is transmitted to when the reception data is received. Also, the physical quantity measured in this embodiment is not limited to time or distance and may also be various other physical quantities such as flow rate, flow velocity, frequency, velocity, acceleration angular velocity, and angular acceleration.

Figure 12:
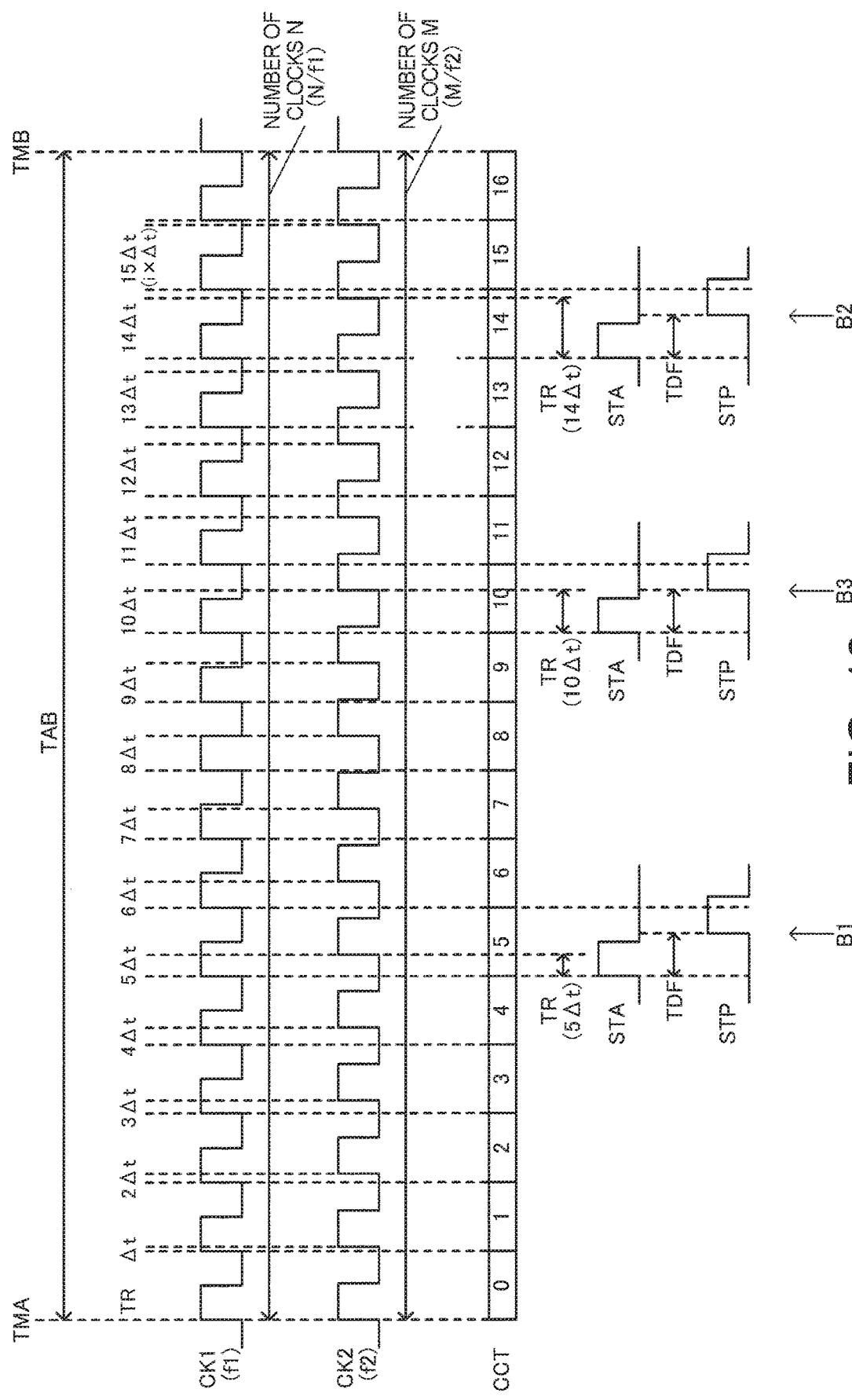
FIG. 12 shows signal waveforms to explain an example of time-digital conversion.

FIG. 12 shows signal waveforms for explaining the time-digital conversion method in this embodiment. At a phase synchronization timing TMA, the phases of the clock signals CK1, CK2 are synchronized and the transition timings of the clock signals CK1, CK2 coincide with each other. Subsequently, the inter-clock time difference TR (phase difference) between the clock signals CK1, CK2 increases by Δt each in each clock cycle (CCT), for example, to Δt, Δ2, Δ3, and the like. Then, at the next phase synchronization timing TMB, for example, the phases of the clock signals CK1, CK2 are synchronized and the transition timings of the clock signals CK1, CK2 coincide with each other.

In this embodiment, a plurality of resonators XTAL1, XTAL2 is used, and a time is converted into a digital value the difference between their clock frequencies. That is, the time-to-digital converter 20 converts a time into a digital value, with a resolution corresponding to the frequency difference |f1−f2| between the clock frequencies f1, f2. For example, the time-to-digital converter 20 converts a time into a digital value, utilizing the principle of slide calipers. This makes is possible to set a resolution of time-digital conversion, using the frequency difference |f1−f2|, and thus improve the performance such as accuracy and resolution of time-digital conversion. Specifically, the resolution Δt of time-digital conversion (time resolution) can be expressed by Δt=|1/f1−1/f2|=|f1−f2|/(f1×f2). The time-to-digital converter 20 converts a time into a digital value, with the resolution Δt=|1/f1−1/f2|=|f1−f2|/(f1×f2). The resolution is expressed by Δt=|f1−f2|/(f1×f2) corresponding to the frequency difference |f1−f2|.

Thus, the resolution of time-digital conversion can be set based on the setting of the clock frequencies f1, f2. For example, by reducing the frequency difference |f1−f2|, it is possible to reduce the resolution Δt and realize high-resolution time-digital conversion. Also, by making the clock frequencies f1, f2 higher, it is possible to reduce the Δt and realize high-resolution time-digital conversion. Then, generating the clock signals CK1, CK2 using the resonators XTAL1, XTAL2 enables improved accuracy of time-digital conversion, compared with when a delay element of a semiconductor element is used. Particularly in this embodiment, since quartz crystal resonators are used as the resonators XTAL1, XTAL2, changes in the clock frequencies f1, f2 due to variations in manufacturing or environmental changes such as temperature change can be minimized. This can also minimize changes in the resolution Δt=|f1−f2|/(f1×f2) and can realize higher performance of time-digital conversion.

As shown in FIG. 12, the length of the period TAB between the phase synchronization timings TMA and TMB corresponds to the number of clocks N of the clock signal CK1. The length of the period TAB also corresponds to the number of clocks M of the clock signal CK2. Here, N and M are integers equal to or greater than 2 and different from each other. In FIG. 12, N=17, M=16, and N−M=1 are given. Also, the relation of TAB=N/f1=M/f2 holds. If f2=16 MHz and N=17, M=16 are set, it results in f1=17 MHz and the relation of N/f1=M/f2 holds. For example, at least one oscillation circuit of the oscillation circuits 101, 102 is controlled in such a way that the relation of N/f1=M/f2 holds. Thus, after the transition timings of the clock signals CK1, CK2 coincide with each other at the phase synchronization timing TMA, the inter-clock time difference TR increases by Δt each, for example, to Δt, Δ2, Δ3 and the like. Then, at the next phase synchronization timing TMB, the transition timings of the clock signals CK1, CK2 coincide with each other and the inter-clock time difference TR becomes zero. Subsequently, the inter-clock time difference TR increases by Δt each in each clock cycle.

Creating such an inter-clock time difference TR which becomes zero at a phase synchronization timing and subsequently increases by Δt (resolution) each can realize time-digital conversion to convert a time into a digital value with the resolution Δt. In the processing of time-digital conversion with the resolution Δt, the inter-clock time difference TR in each clock cycle (CCT) within the period TAB can be univocally specified, as shown in FIG. 12. This can simplify the processing of and circuit configuration for time-digital conversion. Also, making the transition timings of the clock signals CK1, CK2 coincide (substantially coincide) with each other at the phase synchronization timings TMA, TMB enables improvement in the accuracy of time-digital conversion, or the like.

A technique is conceivable to establish the relation of N/f1=M/f2 as the relation of clock frequencies on the design of the first and second quartz crystal resonators, for example, in the related-art technique disclosed in JP-A-5-87954. However, the clock frequencies of the first and second quartz crystal resonators change due to variations in manufacturing and environmental changes such as temperature change. Therefore, even if the relation of N/f1=M/f2 holds on the design, the relation of N/f1=M/f2 does not hold in the actual product. This results in a discrepancy or the like in transition timing and a reduction in the conversion accuracy of time-digital conversion.

In contrast, in this embodiment, for example, the PLL circuits 120, 130 (synchronization circuits) control at least one oscillation circuit of the oscillation circuits 101, 102 in such a way that the clock signals CK1, CK2 have a predetermined frequency relation or phase relation even when the clock frequencies change due to variations in manufacturing or environmental changes. The frequency relation and phase relation of the clock signals CK1, CK2 are thus adjusted in such a way as to compensate for changes due to variations in manufacturing or environmental changes. This enables proper time-digital conversion to be realized even when there are such changes. This can also prevent a conversion error due to a discrepancy between the transition timings of the clock signals CK1, CK2 at the phase synchronization timings TMA, TMB and can achieve higher performance of time-digital conversion.

In this embodiment, the oscillation circuits are thus controlled in such away that relation of N/f1=M/f2 holds. The resolution of time-digital conversion is expressed by the relational expression of Δt=|f1−f2|/(f1×f2). Therefore, the following equation (1) holds.

$$\Delta t = |N-M|/(N \times f2) = |N-M|/(M \times f1) \qquad (1)$$

Thus, the clock signals CK1, CK2 can be generated, based on N, M and the like set according to the resolution Δt required of time-digital conversion. For example, it is assumed that a resolution of Δt=2 ns (nanoseconds) is required of time-digital conversion and that the clock frequency of the clock signal CK2 is f2=100 MHz. In this case, setting N=5 and M=4 in the equation (1) can realize time-digital conversion with a resolution of Δt=|5−4|/(5×f2)=2 ns. In this case, based on the relation of N/f1=M/f2, the clock frequency of the clock signal CK1 is f1=(N/M)×f2=125 MHz. It is now assumed that a resolution of Δt=1 ps (picosecond) is required of time-digital conversion and that the clock frequency of the clock signal CK2 is f2=122.865 MHz. In this case, setting N=8139 and M=8138 in the equation (1) can realize time-digital conversion with a resolution of Δt=|8139−8138|/(8139×f2)=1 ps. In this case, based on the relation of N/f1=M/f2, the clock frequency of the clock signal CK1 is f1=(N/M)×f2=122.880 MHz.

In FIG. 12, after the phase synchronization timing TMA, the inter-clock time difference TR, which is the time difference between the transition timings of the clock signals CK1, CK2 in the first to i-th clock cycles (where i is an integer equal to or greater than 2), is Δt to i×Δt. For example, after the phase synchronization timing TMA, TR=Δt holds in the first clock cycle (CCT=1). Similarly, TR=2Δt to 15Δt holds in the second to fifteenth clock cycles. That is, the inter-clock time difference in the j-th clock cycle (1≤j≤i) is TR=j×Δt.

In this case, in this embodiment, which of the inter-clock time differences TR=Δt to i×Δt between the transition timings of the clock signals CK1, CK2, the time difference TDF between the transition timings of the signals STA and STP corresponds to, is specified. The digital value DQ corresponding to TR is thus found. For example, in a clock cycle indicated by B1 in FIG. 12 (CCT=5), TR=5Δt holds. The time difference TDF between the signals STA, STP is longer than TR=5Δt, that is, TDF>TR=5Δt. In a clock cycle indicated by B2 (CCT=14), TR=14Δt holds. The time difference TDF is shorter than TR=14Δt, that is, TDF<TR=14Δt. In a clock cycle indicated by B3 (CCT=10), TR=10Δt holds. The time difference TDF is equal (substantially equal) to TR=10Δt, that is, TDF=TR=10Δt. Therefore, the time difference TDF between the signals STA, STP is specified as corresponding to TR=10Δt. As a result, it can be determined that the digital value DQ corresponding to the time difference TDF is, for example, a digital value corresponding to TR=10Δt. This can realize time-digital conversion in which the time difference TDF between the signals STA and STP is found, using the inter-clock time difference TR increasing by Δt each after the phase synchronization timing TMA.

Figure 13:
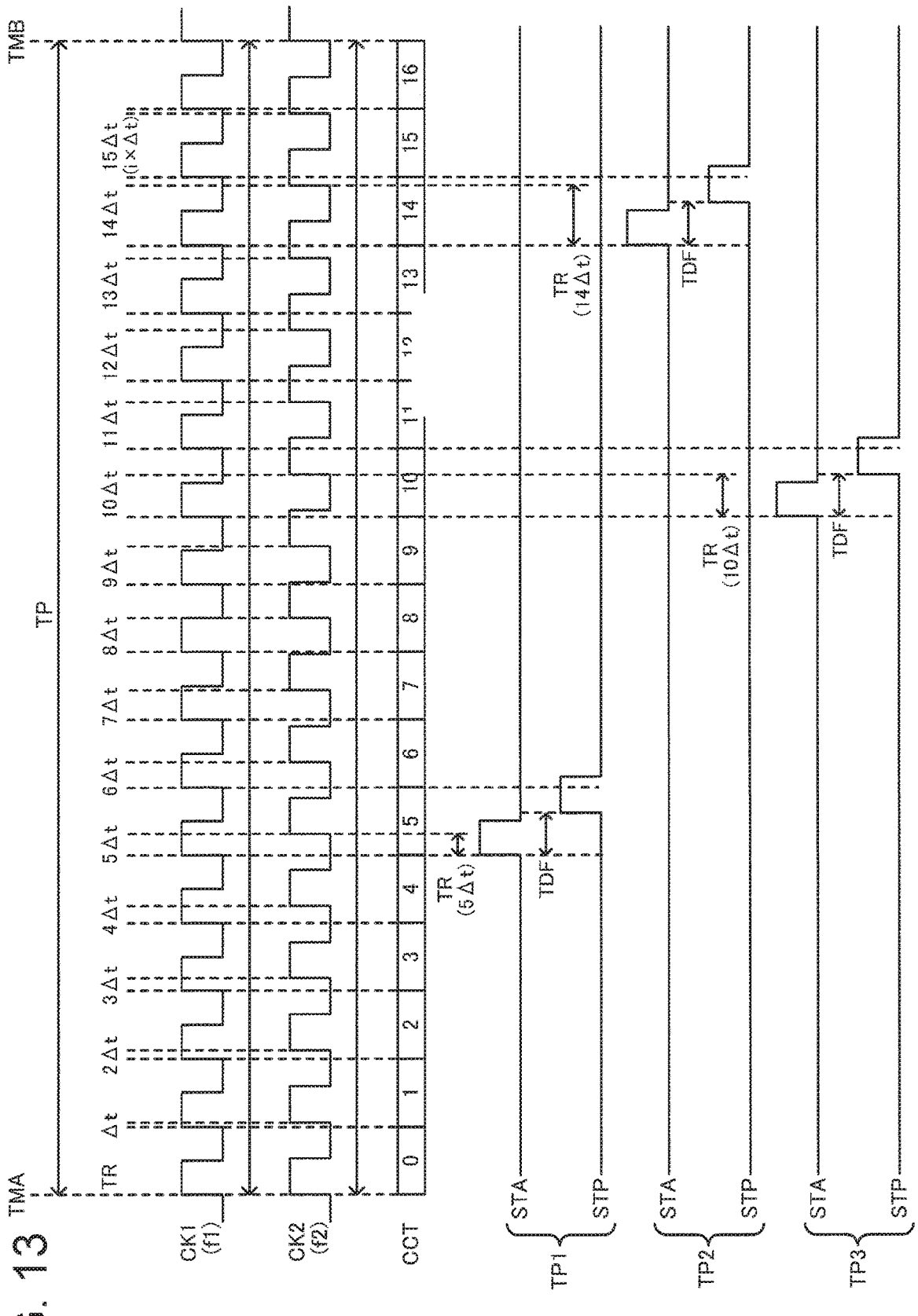
FIG. 13 shows signal waveforms to explain a specific method of time-digital conversion.

FIG. 13 shows an example of the specific method of time-digital conversion according to this embodiment. For example, the period between the phase synchronization timings TMA, TMB is defined as an update period TP. Specifically, the period between the first and second phase synchronization timings of the clock signals CK1, CK2 is an update period TP1. The period between the second and third phase synchronization timings is an update period TP2. The period between the third and fourth phase synchronization timings is an update period TP3. The update period TP2 is the update period subsequent to TP1. The update period TP3 is the update period subsequent to TP2. The subsequent update periods are defined similarly.

In this case, during the update period TP1, the time-to-digital converter 20 generates a signal STA, for example, in the fifth clock cycle (m-th clock cycle, where m is an integer equal to or greater than 1), and acquires a signal STP whose signal level changes according to the generated signal STA. The time-to-digital converter 20 then carries out processing to compare the time difference TDF between the signals STA, STP in the fifth cycle with the inter-clock time difference TR=5Δt. Here, the result of the comparison is that TDF is longer than TR=5Δt.

In the update period TP2 subsequent to the update period TP1, the time-to-digital converter 20 generates a signal STA in the fourteenth clock cycle (n-th clock cycle, where n is an integer equal to or greater than 1, and m and n are different from each other) set according to the result of the comparison in the update period TP1, and acquires a signal STP whose signal level changes according to the generated signal STA. For example, in the update period TP1, the result of the comparison is that TDF is longer than TR=5Δt. Therefore, in the next update period TP2, a clock cycle where TR is longer TR is set. For example, in the update period TP1, the signal STA is generated in the fifth clock cycle, where TR=5Δt holds, whereas in the update period TP2, the signal STA is generated in the fourteenth clock cycle, where TR=14Δt holds. Then, processing to compare TDF in the fourteenth clock cycle with TR=14Δt is carried out. Here, the result of the comparison is that TDF is shorter than TR=14Δt.

In the update period TP3 subsequent to the update period TP2, the time-to-digital converter 20 generates a signal STA in the tenth clock cycle (CCT=10) set according to the result of the comparison in the update period TP2. For example, since the result of the comparison in the update period TP2 is that TDF is shorter than TR=14Δt, a clock cycle where TR is shorter is set. For example, the signal STA is generated in the tenth clock cycle, where TR=10Δt holds. Then, processing to compare TDF in the tenth clock cycle with TR=10Δt is carried out. Here, the result of the comparison is that TDF and TR=5Δt are the same (substantially the same). Therefore, it is determined that the digital value DQ corresponding to the time difference TDF is a digital value corresponding to TR=10Δt.

In this way, in FIG. 13, with the feedback of the result of the comparison in the previous update period, the clock cycle to generate the signal STA in the current update period is set and the comparison of TDF and TR is carried out. Such feedback of the result of the comparison in the previous update period enables higher-speed time-digital conversion. Also, when a time or physical quantity as a measurement target dynamically changes, time-digital conversion which follows this dynamic change can be realized.

The time-digital conversion in this embodiment can be carried out with various modifications. For example, a method (repetition method) may be employed in which a signal STA is generated multiple times during one measurement period for measuring time, so as to carry out phase comparison multiple times (for example, equal to or greater than 1,000 times), thus finding the digital value DQ corresponding to the time difference TDF. Alternatively, a clock cycle designation value (clock cycle designation information) designating the generation of a signal STA in FIG. 13 may be stored in a storage unit (register) of the integrated circuit device 10. Then, a method (method for updating the clock cycle designation value) may be employed in which processing to sequentially update the clock cycle designation value stored in the storage unit, based on the result of the phase comparison between the signal STP and the clock signal CK2 in the respective update periods TP1, TP2, TP3 and the like, thus finding the digital value DQ corresponding to the time difference TDF. Alternatively, a method (binary search method) may be employed in which the digital value DQ corresponding to the time difference TDF between the transition timings of the signals STA and STP is found by binary search, with a resolution corresponding to the frequency difference between the clock frequencies f1, f2. Specifically, the update of the clock cycle designation value based on the result of the phase comparison between the signal STP and the clock signal CK2 is implemented by binary search. Alternatively, after a search range for the digital value DQ is narrowed down by the binary search method, a signal STA may be generated in each clock cycle and phase comparison may be carried out in the period corresponding to the search range, by the method for updating the clock cycle designation value, so as to find the ultimate digital value DQ. Alternatively, the digital value DQ corresponding to the time difference TDF between the transition timings of the signals STA and STP may be found, based on a signal STA inputted from outside the integrated circuit device 10, instead of being generated spontaneously within the integrated circuit device 10, and based on the clock signals CK1, CK2 generated using the resonators XTAL1, XTAL2. For example, time-digital conversion may be carried out with free-running oscillation of the resonators XTAL1, XTAL2 by the oscillation circuits 101, 102.

5. Detailed Configuration Example of Integrated Circuit Device

Figure 14:
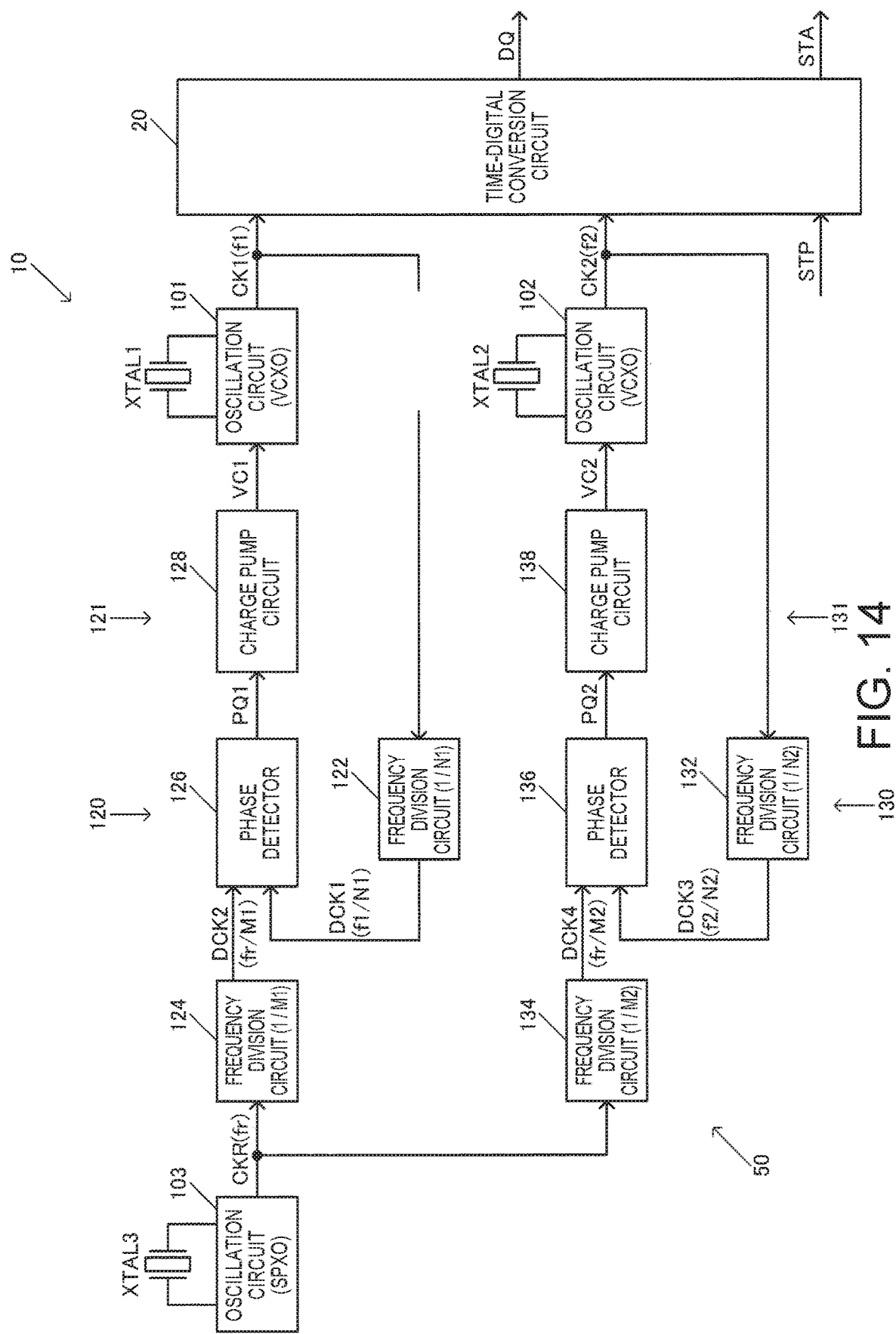
FIG. 14 shows a detailed configuration example of the integrated circuit device and the physical quantity measuring device.

FIG. 14 shows a detailed configuration example of the integrated circuit device 10. The integrated circuit device 10 of FIG. 14 includes PLL circuits 120, 130 and the oscillation circuit 103. The PLL circuit 120 synchronizes the phases of the clock signal CK1 and the reference clock signal CKR (that is, makes the transition timings of these signals coincide with each other) at each first phase synchronization timing (every first period). The PLL circuit 130 synchronizes the phases of the clock signal CK2 and the reference clock signal CKR (that is, makes the transition timings of these signals coincide with each other) at every second phase synchronization timing (every second period). The phases of the clock signals CK1, CK2 are thus synchronized. The clock frequency fr of the reference clock signal CKR is different from the clock frequencies f1, f2 of the clock signals CK1, CK2 and, for example, lower than f1, f2. Using a quartz crystal resonator as the resonator XTAL3 enables the generation of a high-accuracy reference clock signal CKR having less jitter or phase difference and consequently enables the reduction of the jitter and phase difference of the clock signals CK1, CK2. This can achieve a higher accuracy of time-digital conversion, or the like.

The PLL circuit 120 includes frequency division circuits 122, 124, and a phase detector 126. The frequency division circuit 122 divides the clock frequency f1 of the clock signal CK1 by N1 and outputs a frequency-divided clock signal DCK1 with a clock frequency f1/N1. The frequency division circuit 124 divides the clock frequency fr of the reference clock signal CKR by M1 and outputs a frequency-divided clock signal DCK2 having a clock frequency fr/M1. The phase detector 126 compares the phases of the frequency-divided clock signals DCK1 and DCK2 and outputs a signal PQ1 which is an up/down signal to a charge pump circuit 128. The oscillation circuit 101 (VCXO) oscillates the resonator XTAL1 whose oscillation frequency controlled based on a control voltage VC1 from the charge pump circuit 128, and thus generates the clock signal CK1. The PLL circuit 130 includes frequency division circuits 132, 134, and a phase detector 136. The frequency division circuit 132 divides the clock frequency f2 of the clock signal CK2 by N2 and outputs a frequency-divided clock signal DCK3 with a clock frequency f2/N2. The frequency division circuit 134 divides the clock frequency fr of the reference clock signal CKR by M2 and outputs a frequency-divided clock signal DCK4 having a clock frequency fr/M2. The phase detector 136 compares the phases of the frequency-divided clock signals DCK3 and DCK4 and outputs a signal PQ2 which is an up/down signal to a charge pump circuit 138. The oscillation circuit 102 (VCXO) oscillates the resonator XTAL2 whose oscillation frequency controlled based on a control voltage VC2 from the charge pump circuit 138, and thus generates the clock signal CK2.

The control signal generation circuit 121 of FIGS. 7 and 8 is implemented by the frequency division circuits 122, 124, the phase detector 126, and the charge pump circuit 128. The control signal generation circuit 131 is implemented by the frequency division circuits 132, 134, the phase detector 136, and the charge pump circuit 138.

Figure 15:
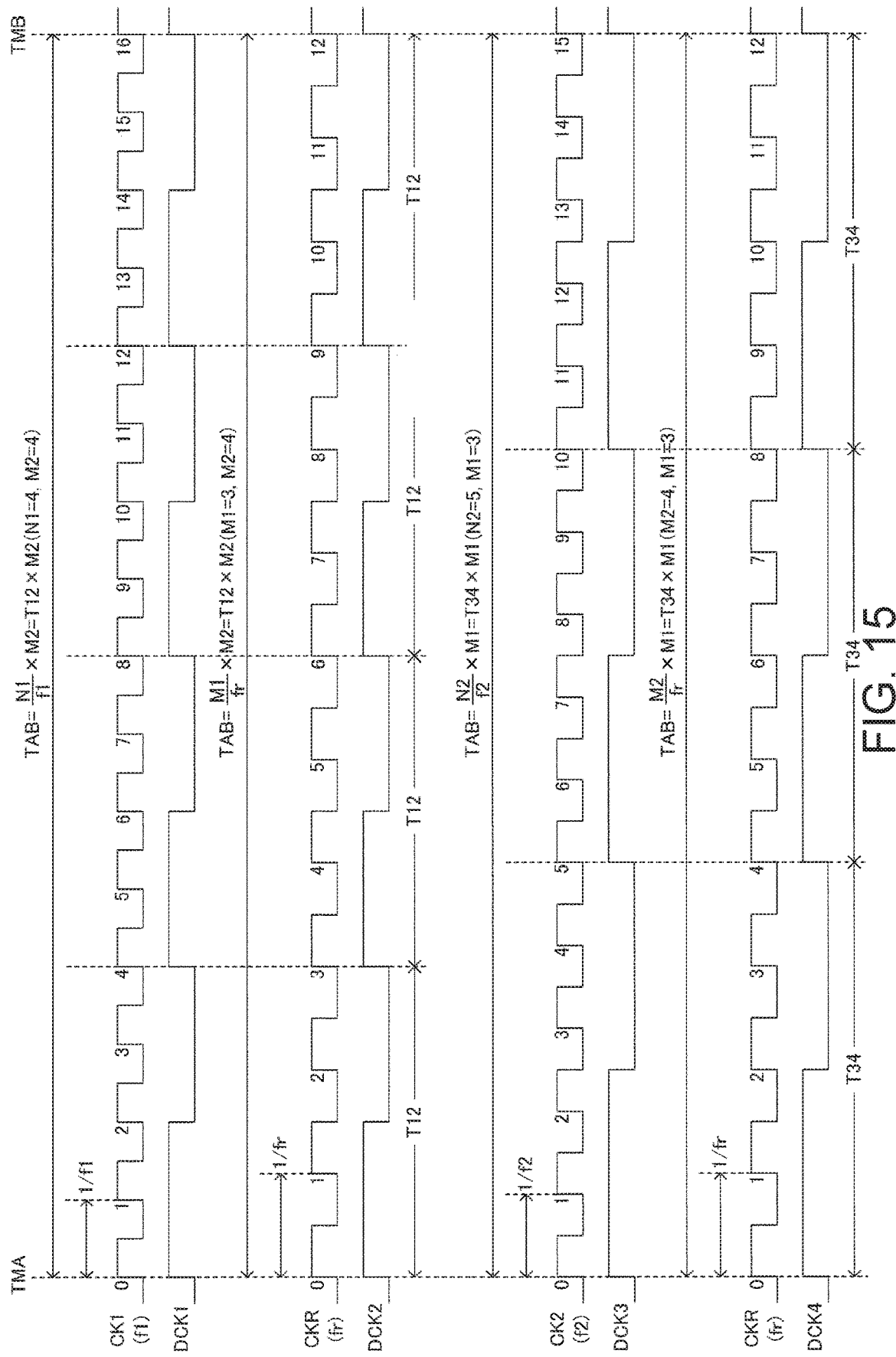
FIG. 15 shows signal waveforms to explain time-digital conversion in the detailed configuration example.

FIG. 15 shows signal waveforms to explain the operation of the integrated circuit device 10 of FIG. 14. To simplify the explanation, FIG. 15 shows an example where N1=4, M1=3, N2=5, and M2=4. However, in practice, N1, M1, N2, and M2 are set to very large numbers.

As shown in FIG. 15, a signal resulting from dividing the clock frequency of the clock signal CK1 by N1=4 is DCK1, and a signal resulting from dividing the clock frequency of the reference clock signal CKR by M1=3 is DCK2. The phases of these signals are synchronized every period T12. That is, the PLL circuit 120 carries out phase synchronization of CK1 and CKR in such a way that the relation of T12=N1/f1=M1/fr holds. Meanwhile, a signal resulting from dividing the clock frequency of the clock signal CK2 by N2=5 is DCK3, and a signal resulting from dividing the clock frequency of the reference clock signal CKR by M2=4 is DCK4. The phases of these signals are synchronized every period T34. That is, the PLL circuit 130 carries out phase synchronization of CK2 and CKR in such a way that the relation of T34=N2/f2=M2/fr holds. As the phases of the signals CK1 and CKR are synchronized every period T12 and the phases of the signals CK2 and CKR are synchronized every period T34, the phases of the clock signals CK1, CK2 are synchronized every period TAB. Here, the relation of TAB=T12×M2=T34×M1 holds. For example, if M2=4 and M1=3, it results in TAB=T12×4=T34×3.

In practice, the division ratios N1, M1, N2, M2 of the frequency division circuit 122, 124, 132, 134 of FIG. 14 are set to very large numbers. For example, if the clock frequency of the reference clock signal CKR is fr=101 MHz and the division ratios N1 and M1 are set to N1=101 and M1=100, the PLL circuit 120 generates the clock signal CK1 with f1=102.01 MHz. If the division ratios N2 and M2 are set to N2=102 and M2=101, the PLL circuit 130 generates the clock signal CK2 with f2=102 MHz. This makes is possible to set the resolution of time-digital conversion to Δt=|1/f1−1/f2|=0.96 ps (picoseconds) and realize high-resolution time-digital conversion.

N1 and M1 are integers equal to or greater than 2 and different from each other. Similarly, N2 and M2 are integers equal to or greater than 2 and different from each other. At least one of N1 and M1 and at least one of N2 and M2 are different integers from each other. Preferably, N1 and N2 have a greatest common divisor of 1 and a least common multiple of N1×N2, and M1 and M2 have a greatest common divisor of 1 and a least common multiple of M1×M2. In this embodiment, N1, M1, N2, and M2 are set in such a way that the relation of |N1×M2−N2×M1|=1 holds. To take the example of FIG. 15, where N1=1, M1=3, N2=5, and M2=4 are set, |N1×M2−N2×M1|=|4×4−5×3|=1 holds. This means that the length of 16 clock signals CK1 is equal to the length of 15 clock signals CK2. This causes the clock signals CK1 and CK2 to shift from each other by one clock cycle (one clock period), every period TAB, and thus can realize time-digital conversion using the principle of slide calipers.

In FIGS. 14 and 15, phase synchronization of CK1 and CKR is carried out every period T12, which is shorter than the period TAB, and phase synchronization of CK2 and CKR is carried out every period TR34, which is shorter than the period TAB. Therefore, phase comparison is carried out at a higher frequency than in a configuration example having only one PLL circuit, described later, and the jitter (accumulated jitter) and phase noise of the clock signals CK1, CK2 can be reduced. Particularly, if N1, M1, N2, and M2 are set to large numbers in order to realize a high resolution Δt, the length of the period TAB is very long in the configuration example having only one PLL circuit. This causes the accumulation of errors, resulting in large jitter and phase difference. In contrast in FIGS. 14 and 15, phase comparison is carried out every period T12 and every T34, which are shorter than the period TAB. This can reduce the accumulated errors and can improve the jitter and phase difference.

The PLL circuits 120, 130 of FIG. 14 have an analog circuit configuration but may also employ a digital (ADPLL) circuit configuration. In this case, each PLL circuit (120, 130) can be implemented by a phase detector having a counter and a TDC, and a digital computing unit or the like. The counter generates digital data equivalent to the integer part of the result of dividing the clock frequency (fr) of the reference clock signal (CKR) by the clock frequency (f1, f2) of the clock signal (CK1, CK2). The TDC generates digital data equivalent to the decimal part of the result of the division. Digital data corresponding to the result of adding these integer and decimal parts is outputted to the digital computing unit. The digital computing unit detects a phase difference from set frequency data (FCW1, FCW2), based on the set frequency data and the digital data of the result of comparison from the phase detector, and carries out smoothing of the phase difference. The digital computing unit thus generates frequency control data and outputs the frequency control data to the oscillation circuit (101, 102). The oscillation circuit has its oscillation frequency controlled based on the frequency control data, and generates a clock signal (CK1, CK2).

In this embodiment, the case where the three resonators XTAL1 to XTAL 3 are provided is mainly described. However, the embodiment is not limited to this case. The number of resonators may be two, or may be four or more. For example, while the two PLL circuits 120, 130 are provided in FIG. 14, a configuration with only one PLL circuit may be employed. For example, the PLL circuit compares the phases of a clock signal CK1 generated by a first oscillation circuit and a clock signal CK2 generated by a second oscillation circuit (VCXO) provided in this PLL circuit, then controls the oscillation frequencies of the second oscillation circuit based on the result of the phase comparison (control voltage), and thus synchronizes the phases of the clock signals CK1 and CK2. In this case, only two resonators for the second oscillation circuit may be provided.

Also, each of the oscillation circuits 101 to 103 in this embodiment can be implemented, for example, by a buffer circuit for oscillation, a feedback circuit element (capacitor, resistor) provided between the input side and the output side of the buffer circuit, and a variable capacitance circuit for adjusting the oscillation frequency provided on one of the input side and the output side of the buffer circuit. The buffer circuit may be implemented by one or a plurality of stages (an odd number of stages) of inverter circuits, or may be a buffer circuit made up of a bipolar transistor and a current source. The variable capacitance circuit may be a variable capacitance diode (varactor) whose capacitance value is controlled based on a control voltage, or may be a circuit whose capacitance value is controlled based on a digital value for oscillation control. The first terminals (P1, P3, P5) for oscillation are connected, for example, to one of the input side (gate side, base side) and the output side (drain side, collector side) of the respective oscillation circuits 101 to 103. The second terminals (P2, P4, P6) are connected to the other side.

6. Modifications

Next, modifications of the embodiment will be described. The spontaneous time-digital conversion, in which the signal STA is spontaneously generated, is described with reference to FIGS. 12 and 13. In the spontaneous time-digital conversion, the integrated circuit device 10 outputs the generated signal STA to outside, for example, from the signal terminal PSA of FIG. 7. Based on the outputted signal STA, an external drive circuit having a pulser or the like outputs a start pulse (drive signal) to a transmitting device such as a light emitting unit. For example, if the drive circuit is controlled by an external processing device such as a microcomputer, the signal STA may be outputted to the processing device and the processing device may instruct the drive circuit to output a start pulse. The drive circuit may also be built in the transmitting device such as a light emitting unit. A receiving device such as a light receiving unit then inputs a signal STP which is a stop signal to the signal terminal PSP of the integrated circuit device 10. Time-digital conversion is thus carried out.

In this case, there is a time difference due to a signal delay between the output timing of the signal STA of the integrated circuit device 10 and the output timing of the start pulse of the drive circuit. This time difference results in an offset on the time-digital conversion value. To eliminate such an offset, for example, the start pulse outputted by the drive circuit (or the start designation signal by the processing device) may be sent back to the integrated circuit device 10, and this start pulse (start designation signal) may be inputted as a signal STA' to the signal terminal PSA of FIG. 7. At this point, the signal terminal PSA may be used as an input/output terminal so as to output the signal STA from the signal terminal PSA and input the signal STA' from the drive circuit to the signal terminal PSA. Alternatively, a terminal to output the signal STA may be provided separately from the signal terminal PSA. The time-to-digital converter 20 then finds the time difference TDSTA between the transition timing of the spontaneously generated signal STA and the transition timing of the signal STA' inputted from the external drive circuit (processing device), by the method described with reference to FIGS. 12 and 13. The time-to-digital converter 20 also finds the time difference TDSTP between the transition timing of the signal STA and the transition timing of the signal STP. For example, the first time-digital conversion unit finds the time difference TDSTA and the second time-digital conversion unit finds the time difference TDSTP. Based on the difference value between these time differences (TDSTP-TDSTA), the ultimate time-digital conversion value (DQ) may be found. Thus, the offset caused by the time difference due to the signal delay can be eliminated and more appropriate time-digital conversion can be realized. The time difference TDSTA need not be found constantly and may be found, for example, simply at the initial setting such as when the power is turned on.

Figure 16:
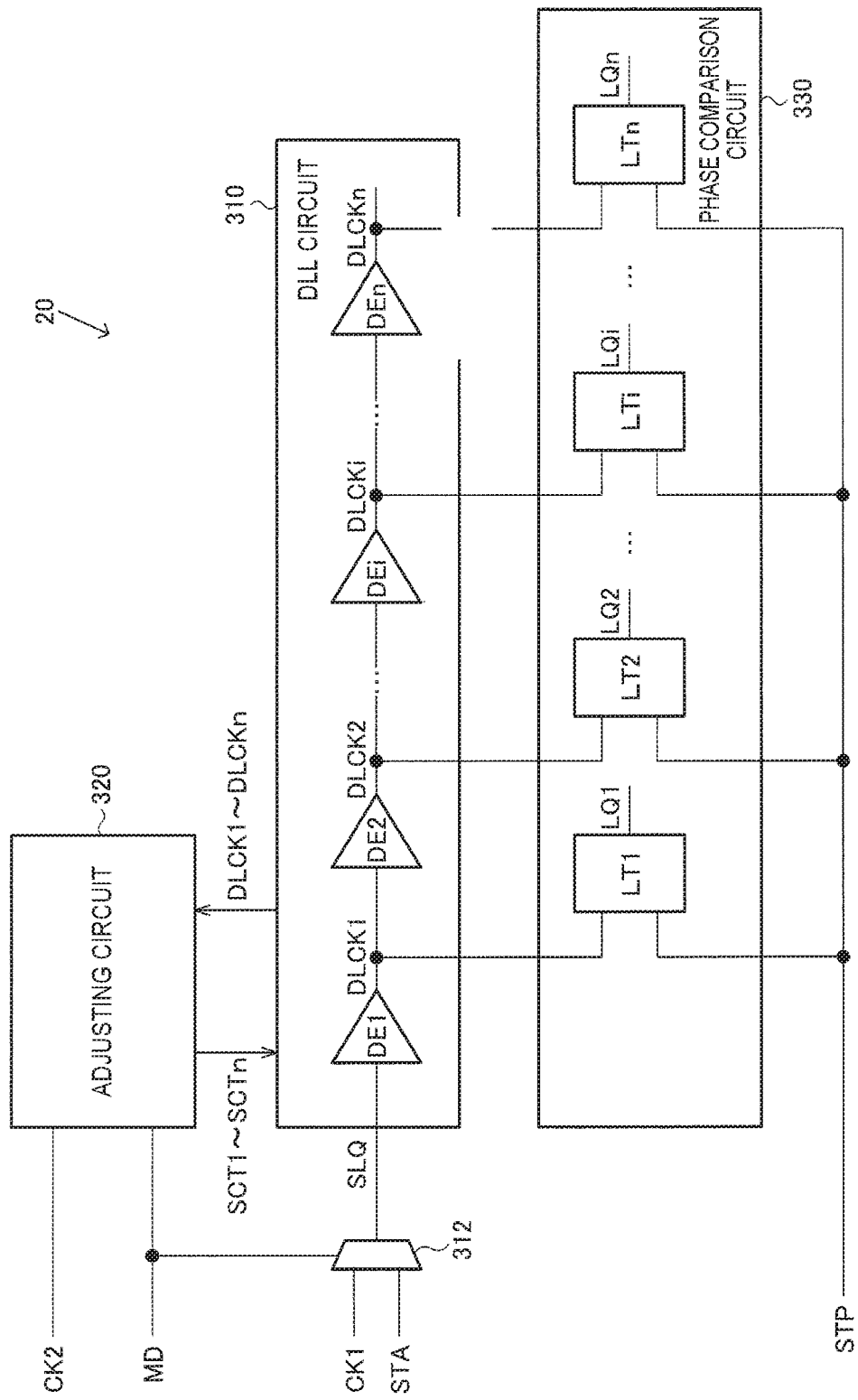
FIG. 16 shows a first modification of the embodiment.
Figure 17:
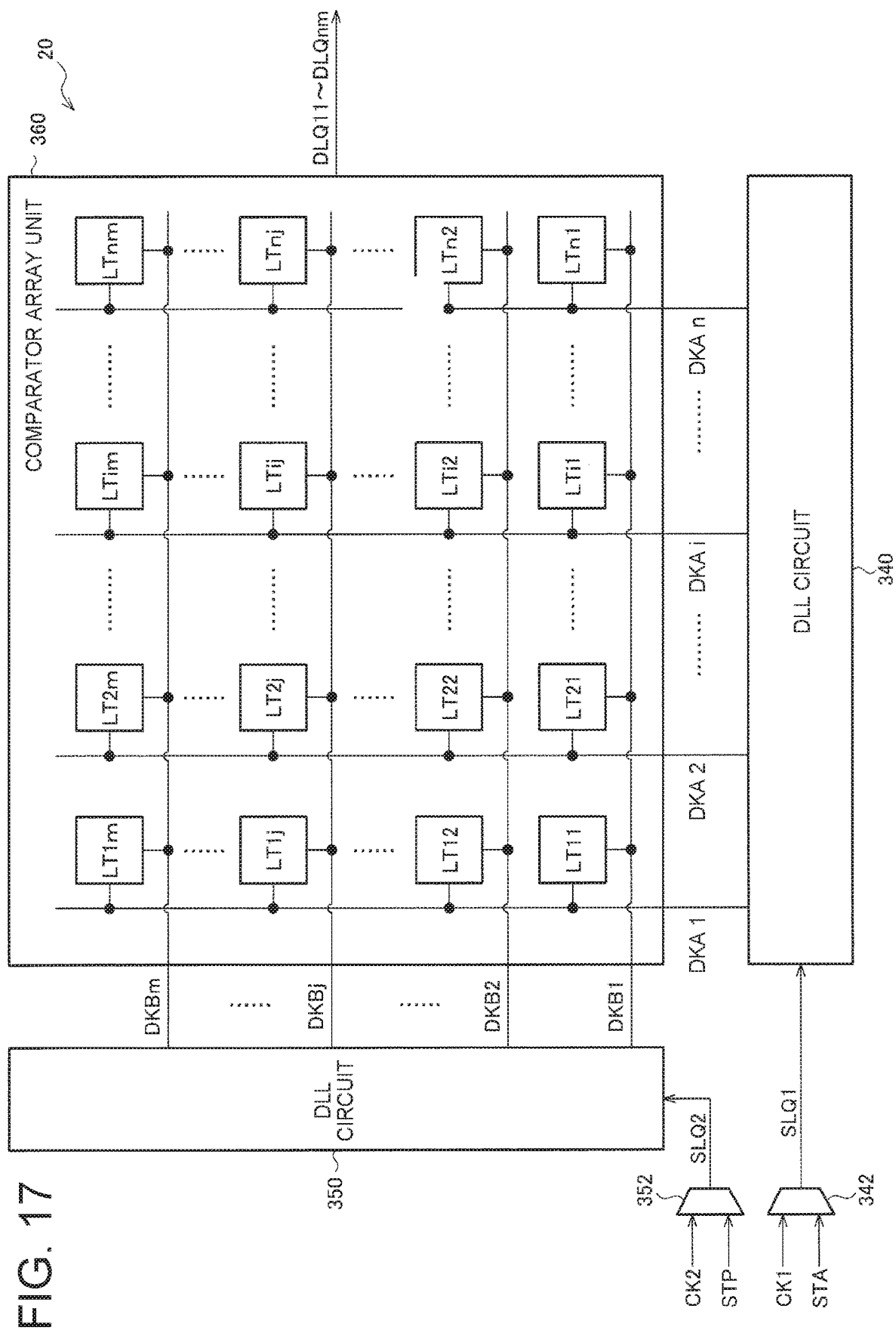
FIG. 17 shows a second modification of the embodiment.

The time-to-digital converter 20 may be a passive circuit which does not spontaneously generate the signal STA. FIGS. 16 and 17 show configuration examples of the passive time-to-digital converter 20, as first and second modifications.

The time-to-digital converter 20 of FIG. 16 includes an adjusting circuit 320, a DLL (delay locked loop) circuit 310, a selector 312, and a phase comparison circuit 330. The DLL circuit 310 includes a plurality of delay elements DE1 to DEn. In a first mode, the selector 312 selects the clock signal CK1. The clock signal CK1 is inputted to the DLL circuit 310 as a signal SLQ. The adjusting circuit 320 adjusts the amount of delay at each delay element to achieve $\Delta t=|1/f1-1/f2|$, based on delay clock signals DLCK1 to DLCKn from the delay elements DE1 to DEn and the clock signal CK2. Each of the delay elements DE1 to DEn has a buffer circuit, and a variable-capacitance capacitor connected to an output node of the buffer circuit, or a variable current source which supplies a current to the buffer circuit. The adjusting circuit 320 adjusts the capacitance value of the variable-capacitance capacitor or the current value of the variable current source, using the respective control signals SCT1 to SCTn, and thus adjusts the amount of delay at each delay element to achieve $\Delta t=|1/f1-1/f2|$. In a second mode, the selector 312 selects the signal STA. The signal STA is inputted to the DLL circuit 310 as a signal SLQ. Phase comparators LT1 to LTn of the phase comparison circuit 330 compares the phases of the delay clock signals DLCK1 to DLCKn from the DLL circuit 310 with the phase of the signal STP. If the transition timing of the signal STP is between the delay clock signals DLCKi−1 and DLCKi, an output signal LQi from the phase comparator LTi is active. This can specify that the time difference TDF between the transition timings of the signals STA and STP is, for example, i×$\Delta t$, and thus enables time-digital conversion with the resolution of $\Delta t=|1/f1-1/f2|$.

FIG. 17 shows an example of 2D Vernier. The time-to-digital converter 20 includes DLL circuits 340, 350, selectors 342, 352, and a comparator array unit 360. The DLL circuit 340 includes a plurality of delay elements, as in FIG. 16. Delay clock signals DKA1 to DKAn from the plurality of delay elements are outputted to the comparator array unit 360. The DLL circuit 350, too, has a plurality of delay elements. Delay clock signals DKB1 to DKBm from the plurality of delay elements are outputted to the comparator array unit 360. In the DLL circuits 340, 350, based on an output from at least one delay element of the plurality of delay elements, feedback control is carried out on the delay time (amount of delay) of the delay elements, and the delay time of the delay elements is locked to a desired delay time. The comparator array unit 360 has phase comparators LT11 to LTnm arranged in n columns by m rows. Based on digital signals DLQ11 to DLQnm, which are the results of phase comparison by these phase comparators LT11 to LTnm, a digital value corresponding to the time difference between the signal STA and STP is found.

In a first mode, the selectors 342, 352 select the clock signals CK1, CK2, respectively. The clock signal CK1 is inputted to the DLL circuit 340 as a signal SLQ1. The clock signal CK2 is inputted to the DLL circuit 350 as a signal SLQ2. In the DLL circuit 340, the delay time of each delay element is locked in such a way that the delay time of the entire plurality of delay elements equals the time TCK1 of one cycle of the clock signal CK1. In the DLL circuit 350, the delay time of each delay element is locked in such a way that the delay time of the entire plurality of delay elements equals the time TCK2 of one cycle of the clock signal CK2. The clock frequencies of the clock signals CK1, CK2 are set to satisfy f1<f2 (TCK1>TCK2). The numbers of delay elements n, m in the DLL circuits 340, 350 are n=m=k, that is, the same number. Therefore, the delay time DLA=TCK1/k of the delay elements of the DLL circuit 340 is longer than the delay time DLB=TCK2/k of the delay elements of the DLL circuit 350. In a second mode, the selectors 342, 352 input the signal STA to the DLL circuit 340 and the signal STP to the DLL circuit 350. The transition timing of the signal STA is earlier than the transition timing of the signal STP. However, the delay time DLA of the delay elements of the DLL circuit 340 is longer than the delay time DLB of the delay elements of the DLL circuit 350. Therefore, with a known technique, the time taken for the transition timing of the signal STA to overtake the transition timing of the signal STP is specified, based on the digital signals DLQ11 to DLQnm from the comparator array unit 360. Thus, a digital value corresponding to the time difference between the signals STA and STP is found.

The time-to-digital converter 20 shown in FIGS. 16 and 17 carries out time-digital conversion, using the clock signals CK1, CK2 generated using the resonators XTAL1, XTAL2. Therefore, higher performance of time-digital conversion can be achieved than with the related-art technique using only the delay time of the semiconductor element. Particularly, synchronizing the phases of the clock signals CK1, CK2 by synchronization circuits such as PLL circuits is advantageous in that higher performance of time-digital conversion and simpler processing can be achieved.

7. Physical Quantity Measuring Device, Electronic Apparatus, Vehicle

FIG. 18 shows a configuration example of the physical quantity measuring device 50 (resonator device) in this embodiment. The physical quantity measuring device 50 includes the integrated circuit device 10 and the resonators XTAL1, XTAL2, XTAL3. The physical quantity measuring device 50 also includes a package 52 which accommodates the integrated circuit device 10 and the resonators XTAL1 to XTAL3. The package 52 is made up of, for example, a base part 53 and a lid part 54. The base part 53 is, for example, a box-like member made of an insulating material such as ceramics. The lid part 54 is, for example, a flat plate-like member joined to the base part 53. An external connection terminal (external electrode) to connect to an external apparatus is provided, for example, on a bottom surface of the base part 53. The integrated circuit device 10 and the resonators XTAL1 to XTAL3 are airtightly enclosed and accommodated in an inner space S (cavity) formed by the base part 53 and the lid part 54.

The resonators XTAL1 to XTAL3 are realized by resonator elements (piezoelectric resonator elements) such as quartz crystal resonator elements. For example, the resonators XTAL1 to XTAL3 are realized by quartz crystal resonator elements which resonate in the thickness shear mode, such as quartz crystal resonator elements having an AT-cut angle or SC-cut angle. However, the resonators XTAL1 to XTAL3 in this embodiment are not limited to this example and can also be realized by various other resonator elements such as resonator elements which do not resonate in the thickness shear mode or piezoelectric resonator elements made of other materials than quartz crystal.

The resonators XTAL1, XTAL2, XTAL3 are supported above the integrated circuit device 10 (IC chip) by support parts SM1, SM2, SM3. The support parts SM1, SM2, SM3 can be realized, for example, by bumps (metal bumps) which are protruding connection electrodes formed at the terminals P1, P3, P5 of the integrated circuit device 10 of FIGS. 7 and 8. The terminals P1, P3, P5 of the integrated circuit device 10 and lower electrodes (in abroad sense, electrodes on one side; not illustrated) of the resonators XTAL1, XTAL2, XTAL3 are electrically connected by the bumps, which are the support parts SM1, SM2, SM3, and thus supported at one point on the integrated circuit device 10. The terminals P2, P4, P6 of the integrated circuit device 10 and upper electrodes (in a broad sense, electrodes on the other side; not illustrated) of the resonators XTAL1, XTAL2, XTAL3 are electrically connected by wire bonding or the like. This enables the plurality of resonators XTAL1 to XTAL3 to be installed directly above the integrated circuit device 10 and thus can realize a small-sized physical quantity measuring device 50 such that the resonators XTAL1 to XTAL3 and the integrated circuit device 10 can be accommodated compactly in the package 52. Installing directly above the integrated circuit device 10 refers to, for example, installing the resonators XTAL1 to XTAL3 above the integrated circuit device 10 without having any member or element between the integrated circuit device 10 and the resonators XTAL1 to XTAL3. For example, the integrated circuit device 10 and the resonators XTAL1 to XTAL3 are arranged in such a way that the integrated circuit device 10 and the resonators XTAL1 to XTAL3 are parallel (substantially parallel) to each other as viewed in a side view and that the main surface of the integrated circuit device 10 and the main surfaces of the resonators XTAL1 to XTAL3 face each other. The distance between the main surfaces of the integrated circuit device 10 and the resonators XTAL1 to XTAL3 is short, corresponding to the height of the bumps.

Figure 19:
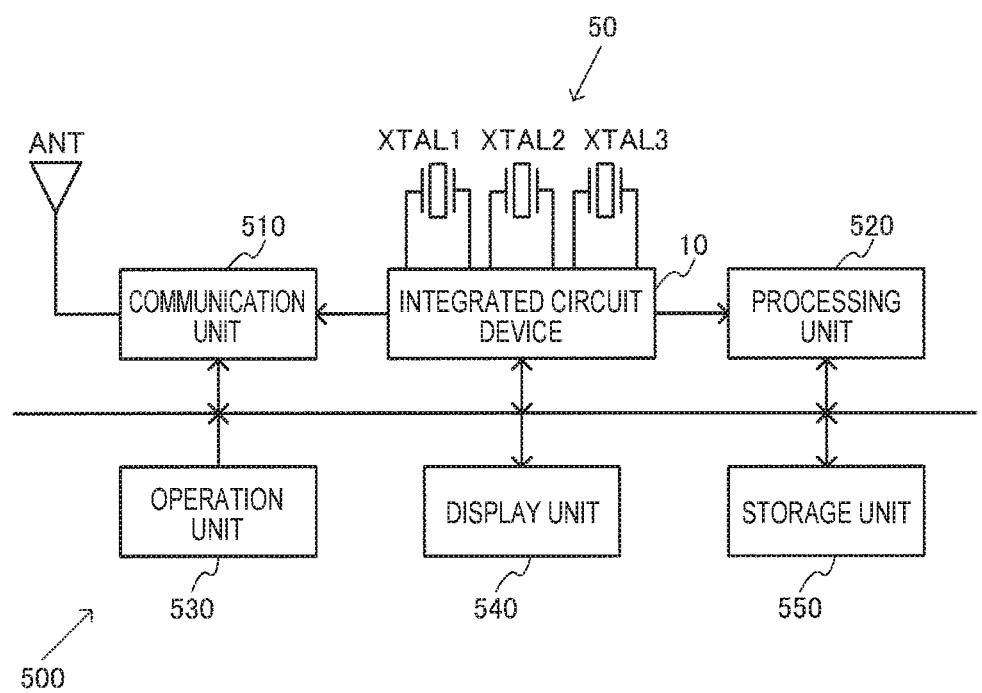
FIG. 19 shows a configuration example of an electronic apparatus.

FIG. 19 shows a configuration example of an electronic apparatus 500 including the integrated circuit device 10 according to the embodiment. The electronic apparatus 500 includes the integrated circuit device 10, the resonators XTAL1 to XTAL3, and a processing unit 520. The electronic apparatus 500 can also include a communication unit 510, an operation unit 530, a display unit 540, a storage unit 550, and an antenna ANT. The electronic apparatus 500 can be, for example, a measuring apparatus which measures a physical quantity such as distance, time, flow rate or flow velocity, a biological information measuring apparatus (ultrasonic measuring device, pulse monitor or the like) which measures biological information, a vehicle-mounted apparatus (apparatus for automatic driving or the like), or a network-related apparatus such as a base station or router. The electronic apparatus 500 can also be a wearable apparatus such as a head-mounted display device or timepiece-related apparatus, a robot, a printing device, a projection device, a mobile information terminal (smartphone or the like), a content providing apparatus which distributes content, or a video apparatus such as a digital camera or video camera.

The communication unit 510 (wireless circuit) carries out processing to receive data from outside or transmit data to outside via the antenna ANT. The processing unit 520 (processing circuit) carries out control processing for the electronic apparatus 500 and various kinds of digital processing on data transmitted and received via the communication unit 510. The functions of the processing unit 520 can be implemented, for example, by a processor such as a microcomputer. The operation unit 530 is configured for the user to carry out an input operation and can be implemented by an operation button and a touch panel display or the like. The display unit 540 is configured to display various kinds of information and can be implemented by a display such as a liquid crystal or organic EL display. The storage unit 550 is configured to store data. The functions of the storage unit 550 can be implemented by a semiconductor memory such as a RAM or ROM, or by an HDD (hard disk drive) or the like.

Figure 20:
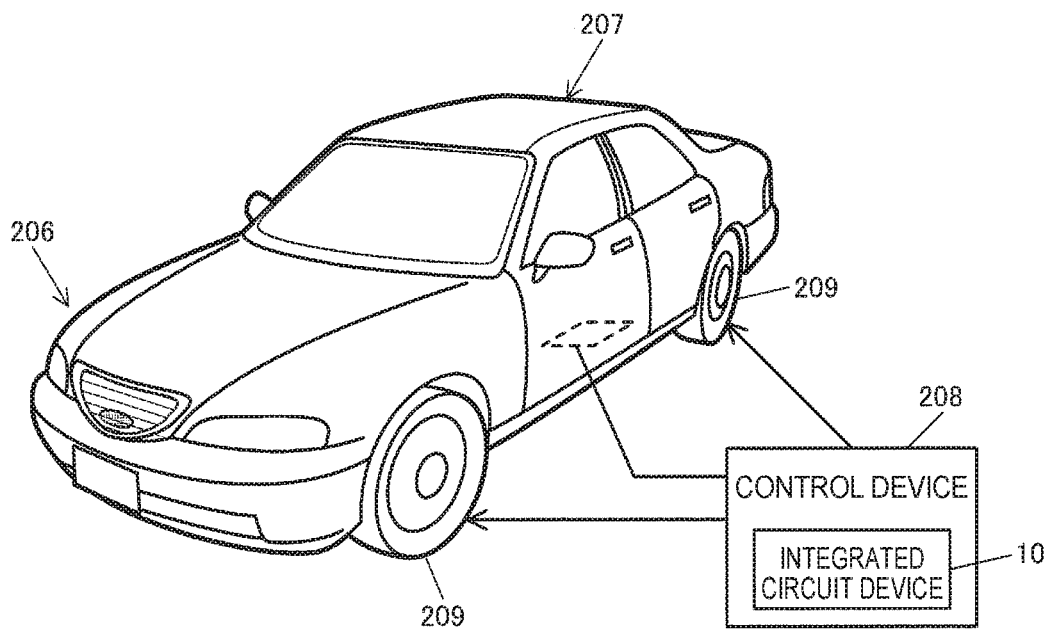
FIG. 20 shows a configuration example of a vehicle.

FIG. 20 shows an example of a vehicle including the integrated circuit device 10 according to the embodiment. The integrated circuit device 10 according to the embodiment can be incorporated in various vehicles such as a car, aircraft, motorcycle, bicycle, robot, or ship. The vehicle is an apparatus or device which has a drive mechanism such as an engine and motor, a steering mechanism such as a steering wheel or steering device, an various electronic apparatuses (vehicle-mounted apparatuses), and travels on the ground, in the air, or by the sea. FIG. 20 schematically shows an automobile 206 as a specific example of the vehicle. A physical quantity measuring device (not illustrated) having the integrated circuit device 10 of the embodiment and an resonator is incorporated in the automobile 206. A control device 208 carries out various kinds of control processing based on physical quantity information measured by the physical quantity measuring device. For example, if distance information of an object around the automobile 206 is measured as the physical quantity information, the control device 208 carries out various kinds of control processing for automatic driving using the measured distance information. The control device 208 controls the softness/stiffness of the suspension or controls the brake on each wheel 209, for example, according to the attitude of a vehicle body 207. The apparatus in which the integrated circuit device 10 of the embodiment is incorporated is not limited to such a control device 208. The integrated circuit device 10 can also be incorporated in various apparatuses provided in a vehicle such as the automobile 206 or a robot.

While the embodiment has been described above in detail, a person skilled in the art can readily understand that a number of modifications can be made without substantially departing from the new matters and advantageous effects of the invention. Therefore, all such modifications should be understood as included in the scope of the invention. For example, a term (PLL circuit or the like) described along with a different term (clock signal generation circuit or the like) having a broader meaning or the same meaning at least once in the specification or drawings can be replaced by that different term in any part of the specification or drawings. Also, all the combinations of the embodiment and modifications are included in the scope of the invention. Moreover, the configurations and operations of the integrated circuit device, the physical quantity measuring device, the electronic apparatus, and the vehicle, and the signal wiring, layout and the like of the integrated circuit device are not limited to those described in the embodiment and can be implemented with various modifications.

The entire disclosure of Japanese Patent Application No. 2017-143163, filed Jul. 25, 2017 is expressly incorporated by reference herein.

What is claimed is:

1. An integrated circuit device comprising:
   an analog front-end circuit that receives a first signal and a second signal, shapes a waveform of the first signal and a waveform of the second signal, outputs the first signal having the shaped waveform to a first signal line, and outputs the second signal having the shaped waveform to a second signal line; and
   a time-to-digital converter that receives the first signal from the analog front-end circuit via the first signal line, receives the second signal from the analog front-end circuit via the second signal line, and converts a time difference between transition timings of the first signal and the second signal into a digital value representing the time difference,
   wherein at least one of the first signal line and the second signal line has redundant wiring, wherein the redundant wiring corresponds to additional wiring that is provided to reroute the at least one of the first signal line and the second signal line from a respective shortest path such that wiring lengths of the first signal line and the second signal line are substantially the same.

2. The integrated circuit device according to claim 1, wherein
   both of the first signal line and the second signal line have the redundant wiring, and
   one signal line of the first signal line and the second signal line has a longer redundant wiring length than the other signal line.

3. The integrated circuit device according to claim 1, wherein
respective wirings of the first signal line and the second signal line have a same number of changes in direction.

4. The integrated circuit device according to claim 1, wherein
the first signal line and the second signal line run parallel to each other with a shield line provided between these signal lines, at a wiring part on a near side from the time-to-digital converter of the wiring part of the first signal line and the second signal line.

5. The integrated circuit device according to claim 4, wherein
at least one of the first signal line and the second signal line is arranged with redundant wiring, at a wiring part on a far side from the time-to-digital converter of the wiring part of the first signal line and the second signal line.

6. The integrated circuit device according to claim 1, comprising:
a first clock signal generation circuit which has a first oscillation circuit, causes the first oscillation circuit to oscillate a first resonator, and outputs a first clock signal thus generated; and
a second clock signal generation circuit which has a second oscillation circuit, causes the second oscillation circuit to oscillate a second resonator, and outputs a second clock signal thus generated,
wherein the time-to-digital converter performs time-digital conversion based on the first clock signal and the second clock signal.

7. The integrated circuit device according to claim 6, wherein
the first clock signal generation circuit outputs the first clock signal to a first clock signal line,
the second clock signal generation circuit outputs the second clock signal to a second clock signal line,
the time-to-digital converter receives the first clock signal from the first clock signal generation circuit via the first clock signal line, receives the second clock signal from the second clock signal generation circuit via the second clock signal line, and performs time-digital conversion based on the first clock signal and the second clock signal inputted thereto, and
at least one of the first clock signal line and the second clock signal line has second redundant wiring, wherein the second redundant wiring corresponds to additional wiring that is provided to reroute the at least one of the first clock signal line and the second clock signal line from a respective shortest path such that wiring lengths of the first clock signal line and the second clock signal line are substantially the same.

8. The integrated circuit device according to claim 7, wherein
one clock signal line of the first clock signal line and the second clock signal line has a longer redundant wiring length than the other clock signal line.

9. The integrated circuit device according to claim 7, wherein
the first clock signal line and the second clock signal line run parallel to each other with a shield line provided between these clock signal lines, at a wiring part on a near side from the time-to-digital converter of the wiring part of the first clock signal line and the second clock signal line.

10. The integrated circuit device according to claim 9, wherein at least one of the first clock signal line and the second clock signal line is arranged with redundant wiring, at a wiring part on a far side from the time-to-digital converter of the wiring part of the first clock signal line and the second clock signal line.

11. The integrated circuit device according to claim 1, comprising
a terminal region where a first signal terminal for the first signal and a second signal terminal for the second signal are arranged,
wherein when a direction from a first side of the integrated circuit toward a second side opposite the first side is defined as a first direction,
the analog front-end circuit is arranged on the first direction side of the terminal region, and
the time-to-digital converter is arranged at least on one side of the first direction side of the analog front-end circuit and the side of a direction intersecting the first direction.

12. A physical quantity measuring device comprising the integrated circuit device according to claim 1.

13. An electronic apparatus comprising the integrated circuit device according to claim 1.

14. A vehicle comprising the integrated circuit device according to claim 1.

15. An integrated circuit device comprising:
an analog front-end circuit that receives a first signal and a second signal, shapes a waveform of the first signal and a waveform of the second signal, outputs the first signal having the shaped waveform from a first signal output terminal, and outputs the second signal having the shaped waveform from a second signal output terminal;
a time-to-digital converter that receives the first signal from the analog front-end circuit via a first signal input terminal, receives the second signal from the analog front-end circuit via a second signal input terminal, and converts a time difference between transition timings of the first signal and the second signal into a digital value representing the time difference;
a first signal line connecting the first signal output terminal and the first signal input terminal; and
a second signal line connecting the second signal output terminal and the second signal input terminal,
wherein the first signal line has first redundant wiring, wherein the first redundant wiring corresponds to additional wiring that is provided to reroute the first signal line from a shortest path between the first signal output terminal and the first signal input terminal,
the second signal line has second redundant wiring, wherein the second redundant wiring corresponds to additional wiring that is provided to reroute the second signal line from a shortest path between the second signal output terminal and the second signal input terminal, and
$DL1<DL2$ and $RL1>RL2$, or $DL1>DL2$ and $RL1<RL2$ hold, where DL1 is a distance between the first signal output terminal and the first signal input terminal, DL2 is a distance between the second signal output terminal and the second signal input terminal, RL1 is a wiring length of the first redundant wiring, and RL2 is a wiring length of the second redundant wiring.

16. An integrated circuit device comprising:
an analog front-end circuit which outputs first to n-th start signals (n being an integer equal to or greater than 2) having waveforms that are shaped, from first to n-th start signal output terminals, based on a start signal, and outputs first to n-th stop signals having waveforms that are shaped, from first to n-th stop signal output terminals, based on a stop signal;

a time-to-digital converter that receives the first to n-th start signals from the analog front-end circuit from first to n-th start signal input terminals, receives the first to n-th stop signals from the analog front-end circuit from first to n-th stop signal input terminals, and performs time-digital conversion based on the first to n-th start signals and the first to n-th stop signals;

first to n-th start signal lines connecting the first to n-th start signal output terminals and the first to n-th start signal input terminals; and first to n-th stop signal lines connecting the first to n-th stop signal output terminals and the first to n-th stop signal input terminals, wherein the j-th stop signal line (where $1 \leq j \leq n$) has j-th redundant wiring, wherein the j-th redundant wiring corresponds to additional wiring that is provided to reroute the j-th stop signal line from a shortest path of the j-th stop signal line, the k-th stop signal line (where $1 \leq k \leq n$, $j \neq k$) has k-th redundant wiring, wherein the k-th redundant wiring corresponds to additional wiring that is provided to reroute the k-th stop signal line from a shortest path of the k-th stop signal line, a distance between the j-th stop signal output terminal and the j-th stop signal input terminal is shorter than a distance between the k-th stop signal output terminal and the k-th stop signal input terminal, and the j-th redundant wiring is longer than the k-th redundant wiring.

17. The integrated circuit device according to claim 16, wherein wiring lengths of the j-th stop signal line and the k-th stop signal line are substantially the same.

\* \* \* \* \*